US012792174B2

(12) United States Patent
Kim et al.

(10) Patent No.: US 12,792,174 B2
(45) **Date of Patent: *Nov. 10, 2026**

(54) DISPLAY DEVICE

(71) Applicant: SAMSUNG DISPLAY CO., LTD., Yongin-si (KR)

(72) Inventors: Hyoeng Ki Kim, Yongin-si (KR); Hyeon Bum Lee, Yongin-si (KR); Hyun Ho Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 19/290,339

(22) Filed: Aug. 4, 2025

(65) Prior Publication Data

US 2025/0355519 A1 Nov. 20, 2025

Related U.S. Application Data

(62) Division of application No. 18/234,316, filed on Aug. 15, 2023, now Pat. No. 12,379,799.

(30) Foreign Application Priority Data

Aug. 25, 2022 (KR) ........................ 10-2022-0106563

(51) Int. Cl.
*H10K 59/122* (2023.01)
*G06F 3/041* (2006.01)
(Continued)

(52) U.S. Cl.
CPC .......... *G06F 3/0412* (2013.01); *G06F 3/0446* (2019.05); *H10K 59/122* (2023.02);
(Continued)

(58) Field of Classification Search
CPC .... G06F 3/0412; G06F 3/0446; G06F 3/0443; G06F 2203/04112; H10K 59/122;
(Continued)

(56) References Cited

U.S. PATENT DOCUMENTS 6,373,544 B1 * 4/2002 Hirabayashi ...... G02F 1/136277 349/149
10,338,449 B2 * 7/2019 Kang .................. B81C 1/00246
(Continued)

FOREIGN PATENT DOCUMENTS

KR 2018-0005327 A 1/2018
KR 10-2021-0004006 A 1/2021
(Continued)

*Primary Examiner* — Amy Onyekaba
(74) *Attorney, Agent, or Firm* — Womble Bond Dickinson (US) LLP

(57) ABSTRACT

A display device, includes: a light emitting element layer including a sub-pixel and a pixel defining film defining the sub-pixel; a thin film encapsulation layer on the light emitting element layer; a pseudo-reflection pattern overlapping the pixel defining film and formed on the thin film encapsulation film; a connection electrode on the pseudo-reflection pattern; a second touch insulating layer on the connection electrode; and a driving electrode and a sensing electrode on the second touch insulating layer, wherein a width of the connection electrode is greater than a width of the driving electrode.

3 Claims, 20 Drawing Sheets

(51) Int. Cl.
*G06F 3/044* (2006.01)
*H10K 59/38* (2023.01)
*H10K 59/40* (2023.01)
*H10K 59/80* (2023.01)

(52) U.S. Cl.
CPC ............. *H10K 59/38* (2023.02); *H10K 59/40* (2023.02); *H10K 59/873* (2023.02); *H10K 59/8791* (2023.02); *H10K 59/8792* (2023.02); *G06F 3/0443* (2019.05)

(58) Field of Classification Search
CPC ...... H10K 59/38; H10K 59/40; H10K 59/873; H10K 59/8791; H10K 59/8792; H10K 59/12; H10K 59/123; H10K 59/126; H10K 59/131; H10K 50/844; H10K 50/856; H10K 50/86
See application file for complete search history.

(56) References Cited

U.S. PATENT DOCUMENTS 10,651,265 B2 * 5/2020 Park .................... H10K 59/1201
11,237,659 B2 2/2022 Kim et al.
11,258,049 B2 * 2/2022 Kim ...................... G06F 3/0412
11,422,656 B2 * 8/2022 Kim ...................... G06F 3/0416
11,442,567 B2 * 9/2022 Bok ...................... G06F 3/0412
12,035,567 B2 7/2024 Kim et al.
12,461,620 B2 11/2025 Kim et al.
2013/0207911 A1 * 8/2013 Barton ..................... H01B 5/14
345/173
2014/0138643 A1 * 5/2014 Choi .................... H10K 59/121
257/40
2014/0152579 A1 * 6/2014 Frey ...................... G06F 3/0416
345/173
2014/0152580 A1 * 6/2014 Weaver ................. G06F 3/0412
345/173
2016/0320670 A1 * 11/2016 Song ................. G02F 1/133377
2017/0278898 A1 * 9/2017 Kim ................... H10K 59/1213
2018/0182814 A1 * 6/2018 Kim ....................... H10K 59/38
2019/0004616 A1 * 1/2019 Baek ...................... G06F 3/0202
2019/0221779 A1 * 7/2019 Jang ...................... G06F 3/0412
2019/0341428 A1 * 11/2019 Lee ...................... H10K 50/125
2020/0111856 A1 * 4/2020 Lee ....................... G06F 3/0445
2020/0117295 A1 * 4/2020 Nakayama ............... H01B 5/14
2020/0212279 A1 * 7/2020 Son ...................... H10H 20/852
2020/0350475 A1 * 11/2020 Lee ...................... H10H 20/857
2020/0365833 A1 * 11/2020 Joo ...................... H10K 59/122
2020/0401246 A1 * 12/2020 Lee ......................... G06F 3/041
2021/0005845 A1 * 1/2021 Kim ...................... G06F 3/0412
2021/0013455 A1 * 1/2021 Bae ...................... H10K 59/122
2021/0066399 A1 * 3/2021 Bae ........................ H10K 59/38
2021/0126056 A1 * 4/2021 Kim ..................... H10K 59/122
2021/0126225 A1 * 4/2021 Park ....................... H10K 50/11
2021/0217831 A1 * 7/2021 Jung .................... H10K 59/873
2021/0223898 A1 * 7/2021 Bok ...................... G06F 3/0412
2021/0273022 A1 * 9/2021 Park ....................... G02B 5/201
2021/0397305 A1 * 12/2021 Cho ...................... G06F 3/0412
2022/0029138 A1 * 1/2022 Wang .................... G06F 3/0412
2022/0069042 A1 3/2022 Jung et al.
2022/0085334 A1 * 3/2022 Oh ......................... H10K 50/19
2022/0086378 A1 * 3/2022 Wang ........................ G09G 3/32
2022/0093708 A1 * 3/2022 Cho ...................... G06F 3/0412
2022/0137742 A1 * 5/2022 Kim ...................... G06F 3/0416
345/174
2022/0187937 A1 * 6/2022 Jang ...................... G06F 3/0412
2022/0190045 A1 * 6/2022 Lee ....................... G06F 3/0412
2022/0199700 A1 * 6/2022 Shin ...................... G06F 3/0412
2022/0206620 A1 * 6/2022 Lee ....................... G06F 3/0412
2022/0320181 A1 * 10/2022 Zhang ............... G02F 1/133512
2022/0352487 A1 * 11/2022 Li ........................ H10K 50/818
2023/0101692 A1 3/2023 Kim et al.
2024/0130204 A1 * 4/2024 Nakamura ....... H10K 59/80522
2024/0196715 A1 * 6/2024 Li ........................ H10K 59/122

FOREIGN PATENT DOCUMENTS

KR 2021-0054390 A 5/2021
KR 10-2021-0107195 A 9/2021
KR 2022-0027448 A 3/2022

* cited by examiner

DISPLAY DEVICE

CROSS-REFERENCE TO RELATED APPLICATIONS

This application is a divisional of U.S. patent application Ser. No. 18/234,316, filed Aug. 15, 2023, which claims priority to and the benefit of Korean Patent Application No. 10-2022-0106563, filed Aug. 25, 2022, the entire content of both of which is incorporated herein by reference.

BACKGROUND

1. Field

Aspects of some embodiments of the present disclosure relate to a display device.

2. Description of the Related Art

As the information society develops, consumer demand for display devices for displaying images has increased in various forms. For example, display devices may be utilized in various electronic devices such as smartphones, digital cameras, notebook computers, navigation devices, and smart televisions.

A display device may include a touch sensing unit for sensing a user's touch, as one of input interfaces. The touch sensing unit may sense the user's touch by including a plurality of touch electrodes driven, for example, in a capacitance manner.

Meanwhile, the display device may have a component hole to mount various components. A protective layer may be formed to protect the component located in the component hole.

The above information disclosed in this Background section is only for enhancement of understanding of the background and therefore the information discussed in this Background section does not necessarily constitute prior art.

SUMMARY

Aspects of some embodiments of the present disclosure include a display device that may be capable of improving luminous efficiency by utilizing a protective layer located in the component hole.

However, aspects of the present disclosure are not restricted to those specifically set forth herein. The above and other aspects of the present disclosure will become more apparent to one of ordinary skill in the art to which the present disclosure pertains by referencing the detailed description of the present disclosure given below.

According to some embodiments, a display device comprises a light emitting element layer including a sub-pixel and a pixel defining film defining the sub-pixel, a thin film encapsulation layer on the light emitting element layer, a pseudo-reflection pattern overlapping the pixel defining film and formed on the thin film encapsulation film, a connection electrode on the pseudo-reflection pattern, a second touch insulating layer on the connection electrode and a driving electrode and a sensing electrode on the second touch insulating layer, wherein the connection electrode has a greater width than the width of the driving electrode.

According to some embodiments, the pseudo-reflection pattern may comprise a first inclination surface adjacent to the sub-pixel, a second inclination surface facing the first inclination surface, and a first upper surface connecting the first inclination surface and the second inclination surface.

According to some embodiments, the connection electrode comprises a third inclination surface on the first inclination surface, a fourth inclination surface on the second inclination surface, and a second upper surface on the first upper surface.

According to some embodiments, the pseudo-reflection pattern does not overlap the sub-pixel.

According to some embodiments, the driving electrode does not overlap the sub-pixel.

According to some embodiments, the second touch insulating layer further comprises a touch contact hole, and wherein the connection electrode is connected to the driving electrode through the touch contact hole.

According to some embodiments, the display device further comprises a first touch insulating layer between the thin film encapsulation layer and the pseudo-reflection pattern.

According to some embodiments, the display device further comprises a first touch insulating on the pseudo-reflection pattern and the thin film encapsulation layer not covered by the pseudo-reflection pattern.

According to some embodiments, the display device further comprises a buffer layer between the thin film encapsulation layer and the pseudo-reflection pattern.

According to some embodiments, the display device further comprises a third touch insulating layer covering the driving electrode and the sensing electrode.

According to some embodiments, the display device further comprises a color filter layer on the third touch insulating layer.

According to some embodiments, the color filter layer includes a color filter and a light blocking member.

According to some embodiments, the light blocking member have a width greater than the width of the driving electrode and equal to or smaller than the width of the connection electrode.

According to some embodiments, the light blocking member have a width greater than the width of pseudo-reflection pattern and equal to or smaller than the width of the connection electrode.

According to some embodiments, the display device comprises a polarization film on the third touch insulating layer.

According to some embodiments, the display device further comprises a component hole penetrating the light emitting element layer, the thin film encapsulation layer and the second touch insulating layer, an inorganic encapsulation layer surrounding the component hole, and a protective layer on the inorganic encapsulation layer.

According to some embodiments, the pseudo-reflection pattern is formed of the same material as the protective layer.

According to some embodiments, the pseudo-reflection pattern is formed of a low-temperature curable photosensitive resin composition.

According to some embodiments, the low-temperature curable photosensitive resin composition is at least one selected from the group consisting of an epoxy-modified siloxane binder or an epoxy monomer, which is alkali-soluble, has a double bond and has reactivity by heat.

According to some embodiments, a display device comprises a light emitting element layer including a sub-pixel and a pixel defining film defining the sub-pixel, a pseudo-reflection pattern overlapping the pixel defining film, a connection electrode on the pseudo-reflection pattern, a component hole penetrating a light emitting element layer and the thin film encapsulation layer, an inorganic encapsulation area surrounding the component hole, and a protective layer on the inorganic encapsulation area, wherein the pseudo-reflection pattern is formed of the same material as the protective layer.

According to some embodiments, the pseudo-reflection pattern is formed of low-temperature curable photosensitive resin composition.

According to some embodiments, the low-temperature curable photosensitive resin composition is at least one selected from the group consisting of an epoxy-modified siloxane binder or an epoxy monomer, which is alkali-soluble, has a double bond and has reactivity by heat.

In a display device according to some embodiments, when the protective layer is formed in the conventional component hole, the reflective pattern may be formed without adding a mask by forming the pseudo-reflection pattern under the connection electrode using the same material. Accordingly, light efficiency may be relatively improved.

However, the characteristics of embodiments according to the present disclosure are not limited to the aforementioned effects, and various other characteristics are included in the present specification.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
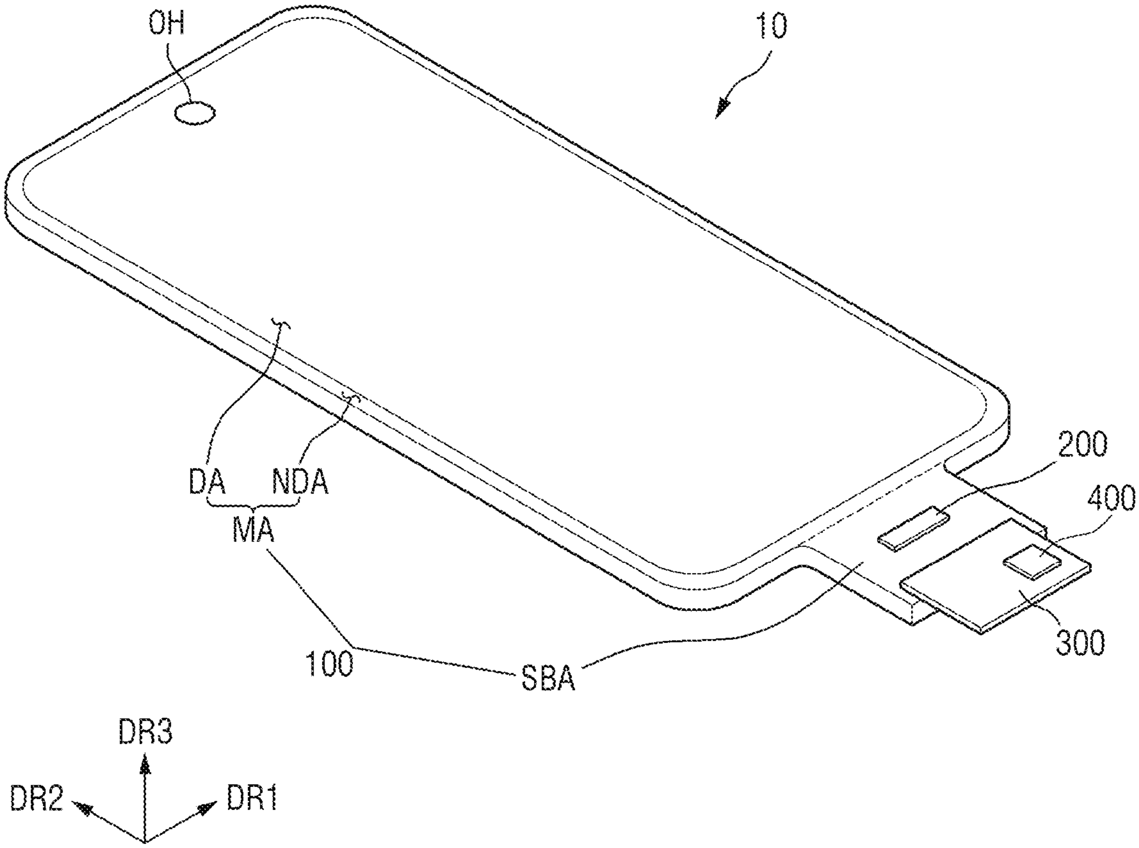
FIG. 1 is a perspective view of a display device according to some embodiments.

Aspects of some embodiments will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

Some of the parts which are not associated with the description may not be provided in order to describe aspects of some embodiments of the disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having,"

"includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within +30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2:
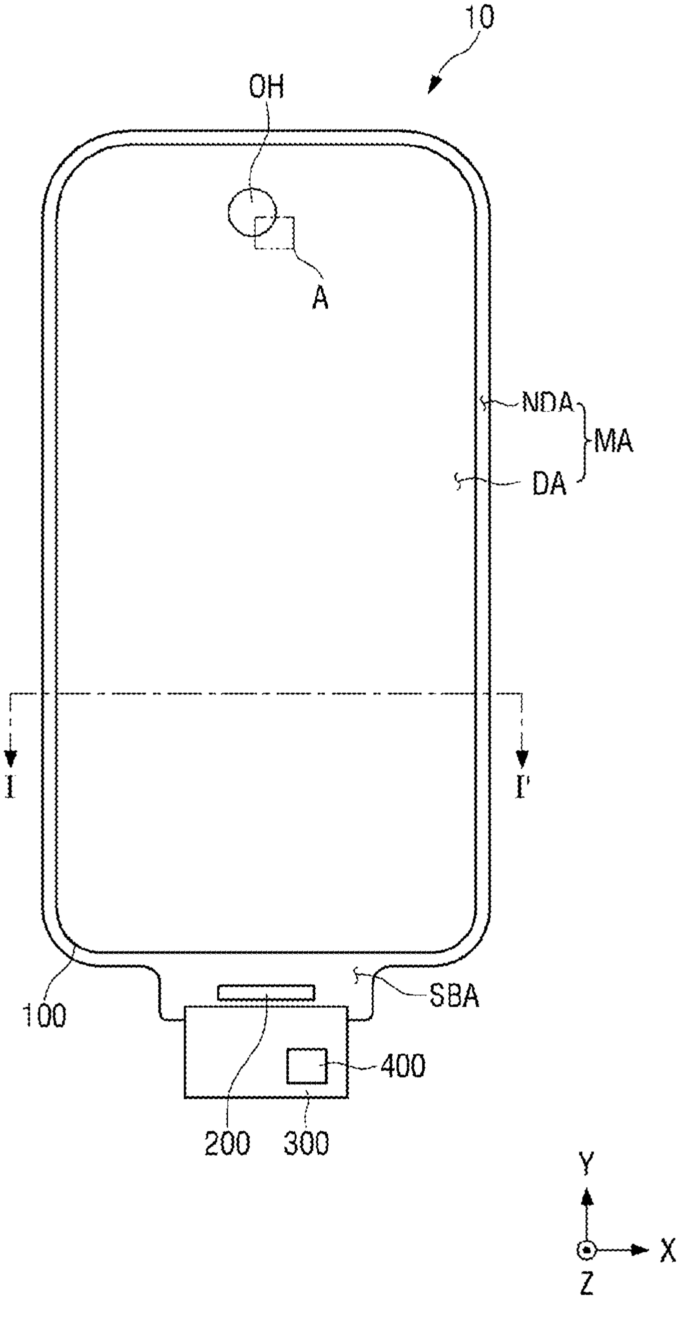
FIG. 2 is a plan view of a display device according to some embodiments.

FIG. 1 is a perspective view of a display device according to some embodiments, and FIG. 2 is a plan view of a display device according to some embodiments.

Referring to FIGS. 1 and 2, the display device 10 is a device for displaying moving images or still images. The display device 10 may be used as a display screen in portable electronic devices such as mobile phones, smartphones, tablet personal computers (PCs), smart watches, watch phones, mobile communication terminals, electronic notebooks, electronic books, portable multimedia players (PMPs), navigation devices and ultra-mobile PCs (UMPCs), as well as in various products such as televisions, notebook computers, monitors, billboards and the Internet of things (IoT).

The display device 10 may be a light emitting display device such as an organic light emitting display device using organic light emitting diodes, a quantum dot light emitting display device including quantum dot light emitting layers, an inorganic light emitting display device including inorganic semiconductors, or a micro or nano light emitting display device using micro or nano light emitting diodes. A case where the display device 10 is an organic light emitting display device will be mainly described below, but embodiments according to the present disclosure are not limited thereto.

The display device 10 according to the embodiments includes the display panel 100, a display driving circuit 200, and a circuit board 300.

The display panel 100 may be shaped like a rectangular plane having short sides in a first direction DR1 and long sides in a second direction DR2 intersecting the first direction DR1. Each corner where a short side extending in the first direction DR1 meets a long side extending in the second direction DR2 may be rounded with a predetermined curvature or may be right-angled. The planar shape of the display panel 100 is not limited to a quadrilateral shape but may also be another polygonal shape, a circular shape, or an oval shape. The display panel 100 may be formed flat, but embodiments according to the present disclosure are not limited thereto. For example, the display panel 100 may include curved portions formed at left and right ends and having a constant or varying curvature. In addition, the display panel 100 may be formed to be flexible so that it can be curved, bent, folded, or rolled.

A substrate SUB of the display panel 100 may include a main area MA and a sub-area SBA. The main area MA may include a display area DA displaying an image and a non-display area NDA which is a peripheral area of the display area DA. The display area DA may occupy most of the main area MA. The display area DA may be located in a center of the main area MA. The display area DA may include sub-pixels displaying an image. The display area DA may include a component hole OH that may transmit light. The component hole OH may be a physical hole penetrating at least a partial layer of the display panel 100. The component hole OH may overlap a component in the third direction DR3. The component may be an optical sensor that detects light incident through the component hole OH, such as a proximity sensor, an illuminance sensor, and a camera sensor, but is not limited thereto.

The non-display area NDA may neighbor the display area DA. The non-display area NDA may be an area outside the display area DA. The non-display area NDA may surround the display area DA. The non-display area NDA may be an edge area of the display panel 100.

The sub-area SBA may protrude from a side of the main area MA in the second direction DR2. Although the sub-area SBA is unfolded in FIGS. 1 and 2, it may also be bent, in which case the sub-area SBA may be located on a lower surface of the display panel 100. When the sub-area SBA is bent, it may be overlapped by the main area MA in a thickness direction DR3 of a substrate SUB. The display driving circuit 200 may be located in the sub-area SBA.

The display driving circuit 200 may generate signals and voltages for driving the display panel 100. The display driving circuit 200 may be formed as an integrated circuit and attached onto the display panel 100 using a chip-on-glass (COG) method, a chip-on-plastic (COP) method, or an ultrasonic bonding method. However, embodiments according to the present disclosure are not limited thereto. For example, the display driving circuit 200 may also be attached onto the circuit board 300 using a chip-on-film (COF) method.

The circuit board 300 may be attached to an end of the sub-area SBA of the display panel 100. Therefore, the circuit board 300 may be electrically connected to the display panel 100 and the display driving circuit 200. The display panel 100 and the display driving circuit 200 may receive digital video data, timing signals, and driving voltages through the circuit board 300. The circuit board 300 may be a flexible printed circuit board, a printed circuit board, or a flexible film such as a chip-on-film.

A touch driving circuit 400 may be connected to touch electrodes of a touch sensing layer TSL of the display panel 100. The touch driving circuit 400 applies driving signals to the touch electrodes of the touch sensing layer TSL and measures capacitance values of the touch electrodes. Each of the driving signals may be a signal having a plurality of driving pulses. The touch driving circuit 400 may not only determine whether a touch has been input but also calculate touch coordinates at which the touch has been input based on the capacitance values.

The touch driving circuit 400 may be located on the circuit board 300. The touch driving circuit 400 may be formed as an integrated circuit and mounted on the circuit board 300.

The touch driving circuit 400 may be electrically connected to a plurality of driving electrodes and a plurality of sensing electrodes of the touch sensing part TDU. The touch driving circuit 400 applies touch driving signals to the plurality of driving electrodes, and senses a touch sensing signal, for example, a charge change amount of a mutual capacitance, of each of a plurality of touch nodes through the plurality of sensing electrodes. The touch driving circuit 400 may determine whether or not a user has performed a touch, whether or not the user has approached the display device, and the like, according to the touch sensing signal of each of the plurality of touch nodes. The touch of the user indicates that a user's finger or an object such as a pen comes into direct contact with a front surface of the display device 10 located on the touch sensing part TDU. The approach of the user indicates that the user's finger or the object such as the pen is positioned apart from the front surface of the display device 10, such as hovering.

Figure 3:
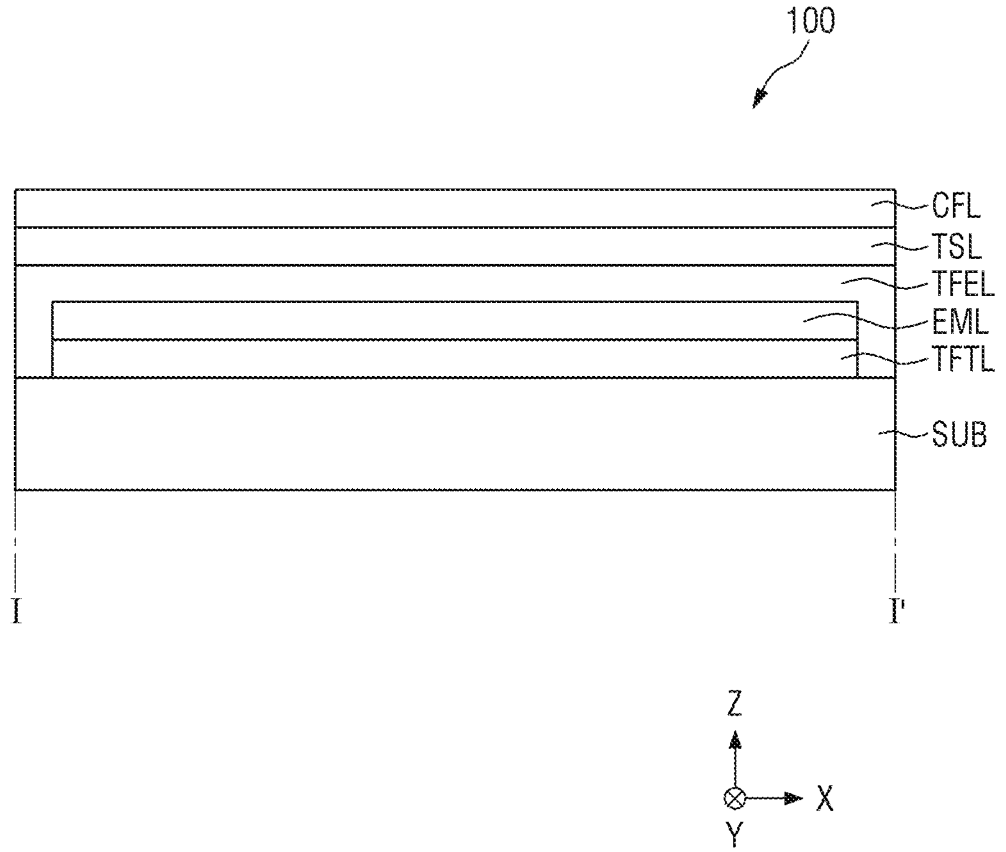
FIG. 3 is a side view illustrating a display device according to some embodiments.

FIG. 3 is a side view illustrating a display device according to some embodiments.

As illustrated in FIG. 3, the display panel 100 may include a substrate SUB, a thin film transistor layer TFTL located on the substrate SUB, a light emitting element layer EML, a thin film encapsulation layer TFEL, touch sensing layer TSL and a color filter layer CFL.

The substrate SUB may be made of an insulating material such as polymer resin. For example, the substrate SUB may be made of polyimide. The substrate SUB may be a flexible substrate that can be bent, folded, rolled, and the like.

The thin film transistor layer TFTL may be located on the substrate SUB. The thin film transistor layer TFTL may be located in the main area MA and the sub-area SBA. The thin film transistor layer TFTL includes thin film transistors.

The light emitting element layer EML may be located on the thin film transistor layer TFTL. The light emitting element layer EML may be located in the display area DA of the main area MA. The light emitting element layer EML includes light emitting elements located in light emitting parts.

The encapsulation layer TFEL may be located on the light emitting element layer EML. The encapsulation layer TFEL may be located in the display area DA and the non-display area NDA of the main area MA. The encapsulation layer TFEL includes at least one inorganic film and at least one organic film for encapsulating the light emitting element layer.

The touch sensing layer TSL may be located on the encapsulation layer TFEL. The touch sensing layer TSL may be located in the display area DA and the non-display area NDA of the main area MA. The touch sensing layer TSL may sense a touch by a person or an object using touch electrodes.

The color filter layer CFL may be located on the touch sensing layer TSL.

Figure 14:
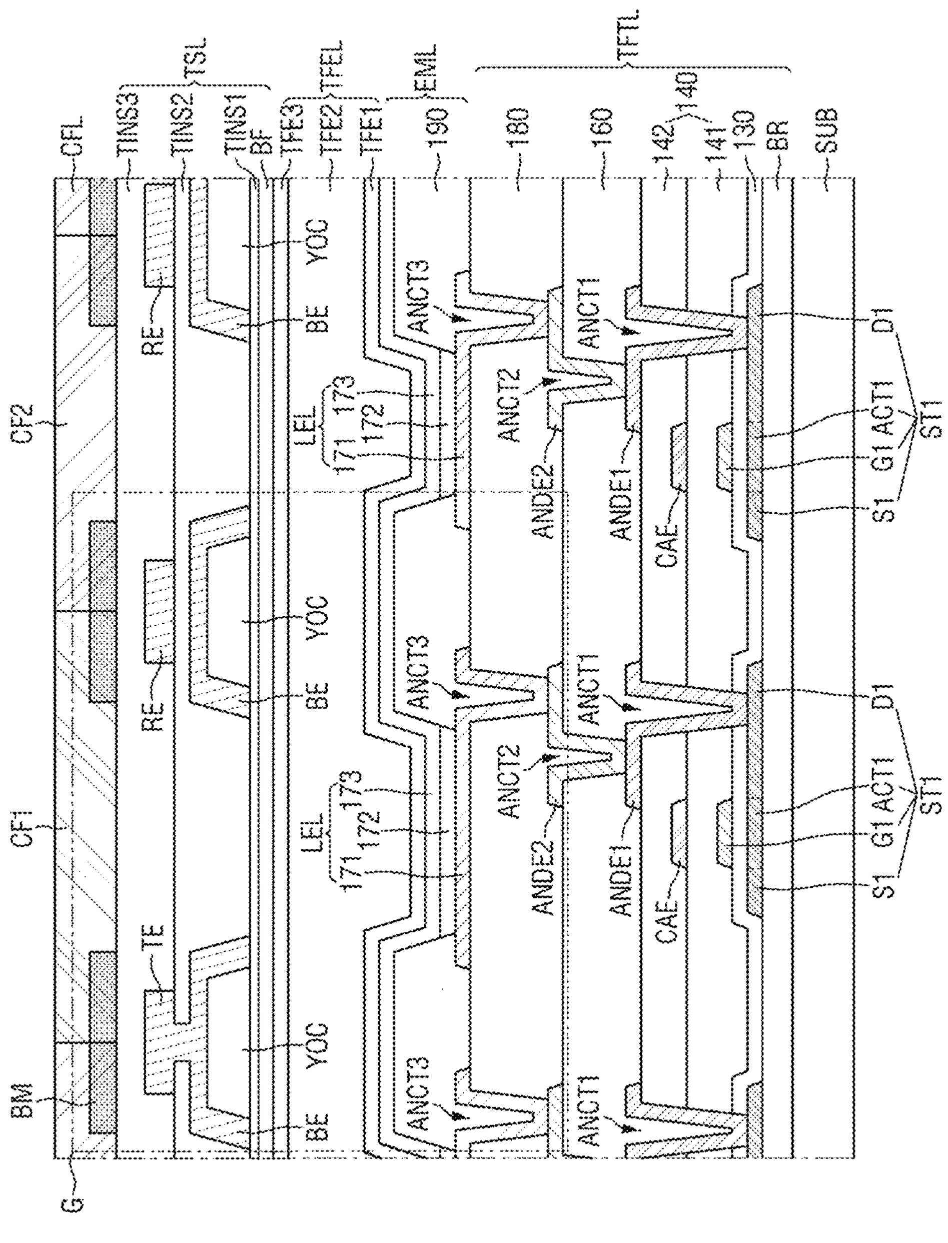
FIG. 14 is a cross-sectional view illustrating still another example of the display panel taken along the line B-B' of FIG. 5 in more detail.

The color filter layer CFL may include a color filter. In addition, the color filter layer CFL may include a light blocking member BM such as black matrix as illustrated in FIG. 14.

A cover window for protecting an upper portion of the display panel 100 may be located on the touch sensing layer TSL.

The cover window may be attached onto the top portion of the display panel 100 by a transparent adhesive member such as an optically clear adhesive (OCA) film or an optically clear resin (OCR). The cover window may be made of an inorganic material such as glass or be made of an organic material such as plastic or a polymer material.

Figure 4:
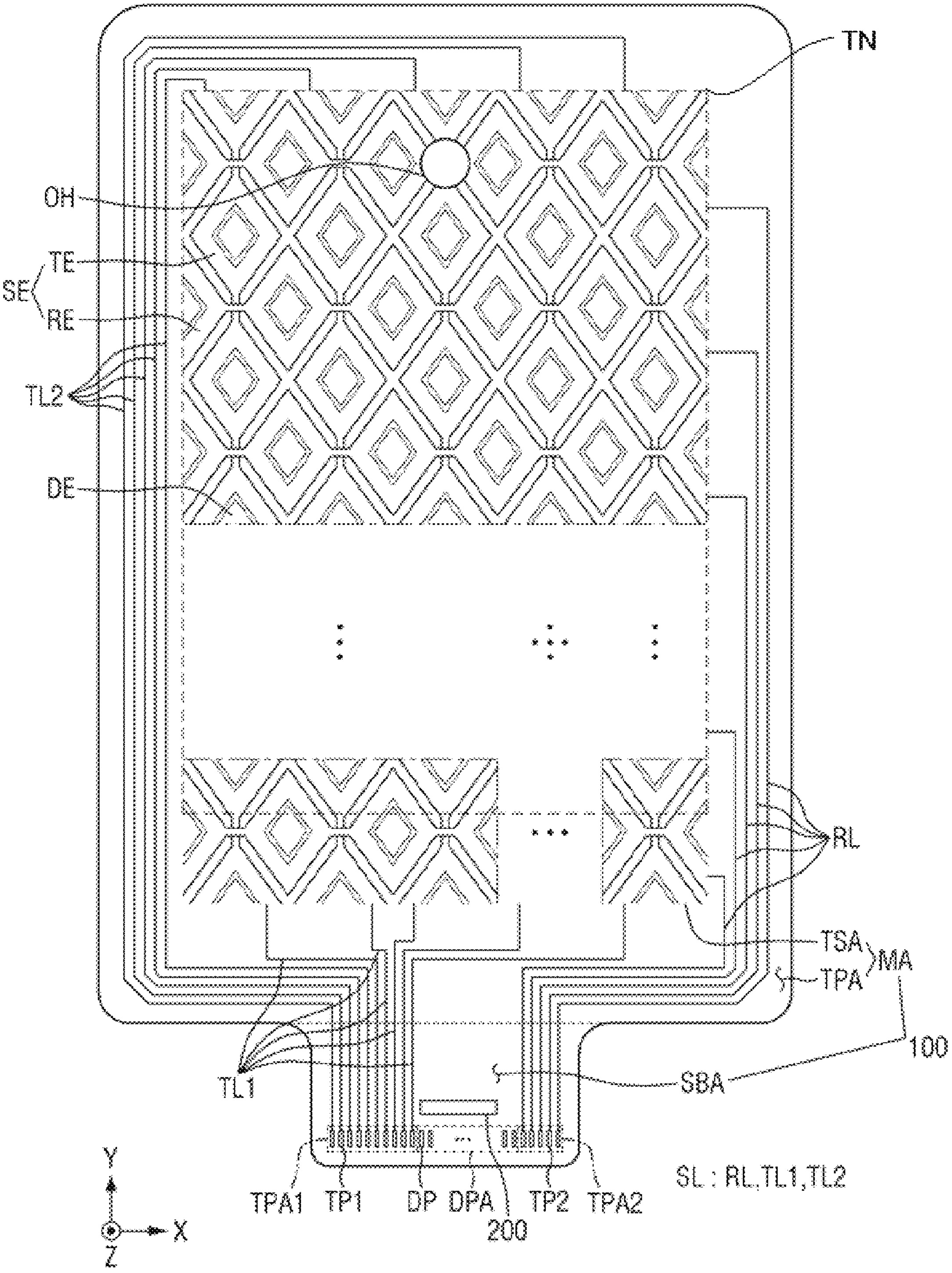
FIG. 4 is a layout view illustrating a touch sensing unit according to some embodiments.

FIG. 4 is a layout view illustrating a touch sensing unit according to some embodiments in more detail.

It has been mainly described in FIG. 4 that touch sensing layer TSL include two types of electrodes, for example, driving electrodes TE and sensing electrodes RE, and are driven in a mutual capacitive manner of sensing a charge change amount of a mutual capacitance of each of a plurality of touch nodes TN through the sensing electrodes RE after applying touch driving signals to the driving electrodes TE.

In FIG. 4, for convenience of explanation, only the driving electrodes TE, the sensing electrodes RE, dummy patterns DE, touch lines TL1, TL2, and RL, and touch pads TP1 and TP2 have been illustrated.

Referring to FIG. 4, the touch sensing layer TSL includes a touch sensing area TSA for sensing a touch by the user and a touch peripheral area TPA located around the touch sensing area TSA. The touch sensing area TSA may overlap the display area (DA in FIGS. 1 and 2) and the touch peripheral area TPA may overlap the non-display area (NDA in FIGS. 1 and 2).

The touch sensing area TSA includes the driving electrodes TE, the sensing electrodes RE, and the dummy patterns DE. The driving electrodes TE and the sensing electrodes RE may be electrodes for forming mutual capacitances in order to sense a touch by an object or a person.

The sensing electrodes RE may be arranged side by side in the first direction (X-axis direction) and the second direction (Y-axis direction). The sensing electrodes RE may be electrically connected to each other in the first direction (X-axis direction). The sensing electrodes RE adjacent to each other in the first direction (X-axis direction) may be connected to each other. The sensing electrodes RE adjacent to each other in the second direction (Y-axis direction) may be electrically disconnected from each other. Accordingly, a touch node TN having mutual capacitance may be located at each of intersections of the driving electrodes TE and the sensing electrodes RE. The plurality of touch nodes TN may correspond to intersections of the driving electrodes TE and the sensing electrodes RE.

The driving electrodes TE may be arranged side by side in the first direction (X-axis direction) and the second direction (Y-axis direction). The driving electrodes TE adjacent in the first direction (X-axis direction) may be electrically separated from each other. The driving electrodes TE may be electrically connected in the second direction (Y-axis direction). For example, the driving electrodes TE adjacent in the second direction (Y-axis direction) may be connected to each other through a connection electrode BE as shown in FIG. 5.

Each of the dummy patterns DE may be surrounded by the driving electrode TE or the sensing electrode RE. Each of the dummy patterns DE may be electrically separated from the driving electrode TE or the sensing electrode RE. Each of the dummy patterns DE may be arranged to be separated from the driving electrode TE and the sensing electrode RE. Each of the dummy patterns DE may be electrically floated.

Figure 5:
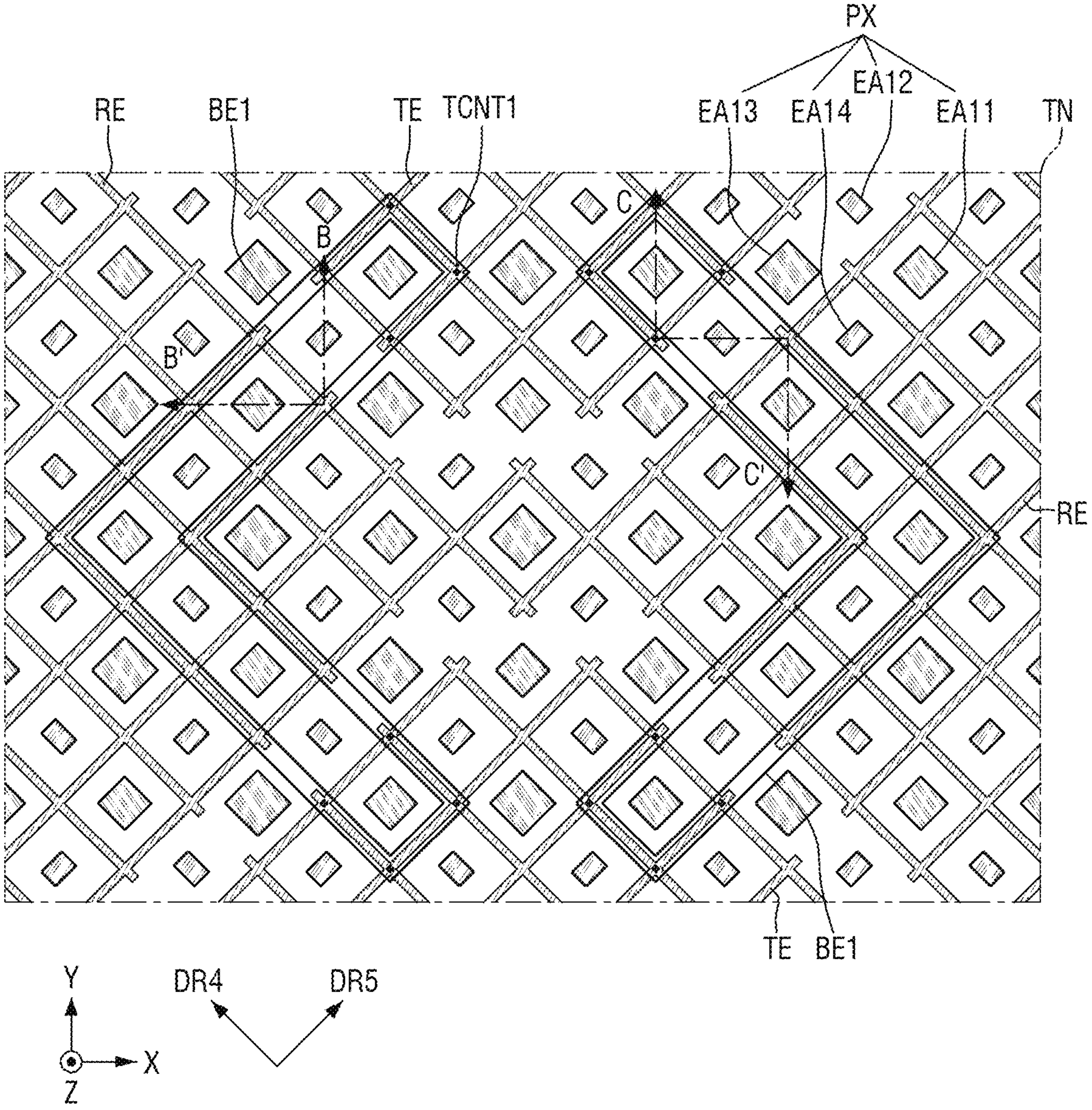
FIG. 5 is a layout view illustrating an example of a touch node of FIG. 4 in more detail.

It has been illustrated in FIG. 5 that each of the driving electrodes TE, the detection electrodes RE, and the dummy patterns DE has a rhombic shape in plan view, but embodiments according to the present disclosure are not limited thereto. For example, each of the driving electrodes TE, the detection electrodes RE, and the dummy patterns DE may have a rectangular shape other than the rhombic shape, a polygonal shape other than the rectangular shape, a circular shape, or an elliptical shape in plan view.

The touch lines TL1, TL2, and RL may be located in a sensor peripheral area TPA. The touch lines TL1, TL2, and RL may include the touch sensing lines RL connected to the sensing electrodes RE, the first touch driving lines TL1 and the second touch driving lines TL2 connected to the driving electrodes TE.

The sensing electrodes RE located at one side of the touch sensing area TSA may be connected to the touch sensing lines RL in a one-to-one manner. For example, as illustrated in FIG. 4, the sensing electrodes RE located at a right end among the sensing electrodes RE electrically connected to each other in the first direction (X-axis direction) may be connected to the touch sensing lines RL. The touch sensing lines RL may be connected to second touch pads TP2 in a one-to-one manner. Therefore, the touch driving circuit 400 may be electrically connected to the sensing electrodes RE.

The driving electrodes TE located at one side of the touch sensing area TSA may be connected to the first touch driving lines TL1 in a one-to-one manner, and the driving electrodes TE located at the other side of the touch sensing area TSA may be connected to the second touch driving lines TL2 in a one-to-one manner. For example, as illustrated in FIG. 4, the driving electrodes TE located at a lower end among the driving electrodes TE electrically connected to each other in the second direction (Y-axis direction) may be connected to the first touch driving lines TL1, and the driving electrodes TE located at an upper end among the driving electrodes TE electrically connected to each other in the second direction (Y-axis direction) may be connected to the second touch driving lines TL2. The second touch driving lines TL2 may be connected to the driving electrodes TE above the touch sensing area TSA via a left outer side of the touch sensing area TSA.

The first touch driving lines TL1 and the second touch driving lines TL2 may be connected to first touch pads TP1 in a one-to-one manner. Therefore, the touch driving circuit 400 may be electrically connected to the driving electrodes TE. Because the driving electrodes TE are connected to the driving lines TL1 and TL2 at both sides of the touch sensing area TSA to receive the touch driving signals, the occurrence of a difference between the touch driving signal applied to the driving electrodes TE located at a lower side of the touch sensing area TSA and the touch driving signal applied to the driving electrodes TE located at an upper side of the touch sensing area TSA due to an RC delay of the touch driving signals may be prevented or reduced.

A first touch pad area TPA1 in which the first touch pads TP1 are located may be located at one side of a display pad area DPA in which the display pads DP are located. A second touch pad area TPA2 in which the second touch pads TP2 are located may be located at the other side of the display pad area DPA. The display pads DP may be electrically connected to data lines of the display panel 100.

The display pad area DPA, the first touch pad area TPA1, and the second touch pad area TPA2 may correspond to the pads of the display panel 100 connected to the circuit board 300 illustrated in FIG. 2. The circuit board 300 may be located on the display pads DP, the first touch pads TP1, and the second touch pads TP2. The display pads DP, the first touch pads TP1, and the second touch pads TP2 may be electrically connected to the circuit board 300 using a conductive adhesive member such as an anisotropic conductive film. Therefore, the display pads DP, the first touch pads TP1, and the second touch pads TP2 may be electrically connected to the touch driving circuit 400 located on the circuit board 300.

Because the driving electrodes TE and the sensing electrodes RE do not overlap the component hole OH, the driving electrodes TE adjacent to the component hole OH may have a different planar shape from the planar shape of the driving electrodes TE not adjacent to the component hole OH. Also, an area of each of the driving electrodes TE adjacent to the component hole OH may be smaller than an area of each of the driving electrodes TE not adjacent to the component hole OH.

In addition, because the sensing electrodes RE do not overlap the component hole OH, the sensing electrodes RE adjacent to the component hole OH may have a different planar shape from the planar shape of the sensing electrodes RE not adjacent to the component hole OH. An area of each of the sensing electrodes RE adjacent to the component hole OH may be smaller than an area of each of the sensing electrodes RE not adjacent to the component hole OH.

FIG. 5 is a layout view illustrating an example of a touch node of FIG. 4 in detail.

Referring to FIG. 5, the touch node TN may be defined as an intersection of the driving electrodes TE and the sensing electrodes RE.

Because the driving electrodes TE and the sensing electrodes RE are located on the same layer, they may be arranged to be spaced apart from each other. That is, a gap may be formed between the driving electrode TE and the sensing electrode RE adjacent to each other.

In addition, the dummy patterns DE may be located on the same layer as the driving electrodes TE and the sensing electrodes RE. That is, a gap may be formed between the driving electrode TE and the dummy pattern DE adjacent to each other and between the sensing electrode RE and the dummy pattern DE adjacent to each other.

The connection electrodes BE may be located on a different layer from the driving electrodes TE and the sensing electrodes RE. The connection electrode BE may be formed to be bent at least once. It has been illustrated in FIG. 5 that the connection electrode BE has a clamp shape ("<" or ">"), but a shape of the connection electrode BE in plan view is not limited thereto. Because the driving electrodes TE adjacent to each other in the second direction (Y-axis direction) are connected to each other by a plurality of connection electrodes BE, even though any one of the connection electrodes BE is disconnected, the driving electrodes TE adjacent to each other in the second direction (Y-axis direction) may be stably connected to each other. It has been illustrated in FIG. 5 that the driving electrodes TE adjacent to each other are connected to each other by two connection electrodes BE, but the number of connection electrodes BE is not limited thereto.

The connection electrode BE may overlap the driving electrodes TE adjacent each other in the second direction (Y-axis direction), in the third direction (Z-axis direction) which is the thickness direction of the substrate SUB. The connection electrode BE may overlap the sensing electrode RE in the third direction (Z-axis direction). One side of the connection electrode BE may be connected to any one of the driving electrodes TE adjacent to each other in the second direction (Y-axis direction) through a touch contact hole TCNT1. The other side of the connection electrode BE may be connected to the other of the driving electrodes TE adjacent to each other in the second direction (Y-axis direction) through a touch contact hole TCNT1.

Due to the plurality of connection electrodes BE, the driving electrodes TE and the sensing electrodes RE may be electrically disconnected from each other at the intersection parts between the driving electrodes TE and the sensing electrodes RE. Therefore, mutual capacitances may be formed between the driving electrodes TE and the sensing electrodes RE.

Each of the driving electrodes TE, the sensing electrodes RE, and the connection electrodes BE may have a mesh shape or a net shape in plan view. In addition, each of the dummy patterns DE may have a mesh shape or a net shape in plan view. Therefore, each of the driving electrodes TE, the sensing electrodes RE, the connection electrodes BE, and the dummy patterns DE may not overlap the respective sub-pixels EA11, EA12, EA13, and EA14 of the pixels PX. Therefore, it is possible to prevent or reduce instances of the light emitted from the sub-pixels EA11, EA12, EA13, and EA14 being blocked by the driving electrodes TE, the sensing electrodes RE, the connection electrodes BE, and the dummy patterns DE to prevent or reduce instances of a decrease in luminance of the light.

Each of the pixels PX may include a first sub-pixel EA11 emitting light of a first color, a second sub-pixel EA12 emitting light of a second color, a third sub-pixel EA13 emitting light of a third color, and fourth sub-pixel EA14 emitting the light of the second color. For example, the first color may be red, the second color may be green, and the third color may be blue. FIG. 5 illustrates that the second sub-pixel EA12 and the fourth sub-pixel EA14 of the pixel PX emit the same color, but embodiments according to the present disclosure are not limited thereto. That is, the second sub-pixel EA12 and the fourth sub-pixel EA14 of the pixel PX may emit different colors.

The first sub-pixel EA11 and the second sub-pixel EA12 of each of the pixels PX may neighbor to each other in a fourth direction DR4, and the third sub-pixel EA13 and the fourth sub-pixel EA14 of each of the pixels PX may neighbor to each other in the fourth direction DR4. The first sub-pixel EA11 and the fourth sub-pixel EA14 of each of the pixels PX may neighbor to each other in a fifth direction DR5, and the second sub-pixel EA12 and the third sub-pixel EA13 of each of the pixels PX may neighbor to each other in the fifth direction DR5.

Each of the first sub-pixel EA11, the second sub-pixel EA12, the third sub-pixel EA13, and the fourth sub-pixel EA14 may have a rhombic shape or a rectangular shape in plan view, but is limited thereto. Each of the first sub-pixel EA11, the second sub-pixel EA12, the third sub-pixel EA13, and the fourth sub-pixel EA14 may have a polygonal shape other than the rectangular shape, a circular shape, or an elliptical shape in plan view. In addition, it has been illustrated in FIG. 6 that the third sub-pixel EA13 has the largest area and the second sub-pixel EA12 and the fourth sub-pixel EA14 have the smallest area, but embodiments according to the present disclosure are not limited thereto.

The second sub-pixels EA12 and the fourth sub-pixels EA14 may be located in odd-numbered rows. The second sub-pixels EA12 and the fourth sub-pixels EA14 may be located side by side in the first direction (X-axis direction) in each of the odd-numbered rows. The second sub-pixels EA12 and the fourth sub-pixels EA14 may be alternately located in each of the odd-numbered rows. Each of the second sub-pixels EA12 may have short sides in the fourth direction DR4 and long sides in the fifth direction DR5, while each of the fourth sub-pixels EA14 may have long sides in the fourth direction DR4 and short sides in the fifth direction DR5. The fourth direction DR4 may be a direction between the first direction (X-axis direction) and the second direction (Y-axis direction), and may be a direction inclined by 45° with respect to the first direction (X-axis direction). The fifth direction DR5 may be a direction perpendicular to the fourth direction DR4.

The first sub-pixels EA11 and the third sub-pixels EA13 may be located in even-numbered rows. The first sub-pixels EA11 and the third sub-pixels EA13 may be arranged side by side in the first direction (X-axis direction) in each of the even-numbered rows. The first sub-pixels EA11 and the third sub-pixels EA13 may be alternately located in the even-numbered rows.

The second sub-pixels EA12 and the fourth light emitting parts EA14 may be located in odd-numbered columns. The second sub-pixels EA12 and the fourth sub-pixels EA14 may be arranged side by side in the second direction (Y-axis direction) in each of the odd-numbered columns. The second sub-pixels EA12 and the fourth sub-pixels EA14 may be alternately located in each of the odd-numbered columns.

The first sub-pixels EA11 and the third sub-pixels EA13 may be located in even-numbered columns. The first sub-pixels EA11 and the third sub-pixels EA13 may be arranged side by side in the second direction (Y-axis direction) in each of the even-numbered columns. The first sub-pixels EA11 and the third sub-pixels EA13 may be alternately arranged in the even-numbered columns.

Figure 6:
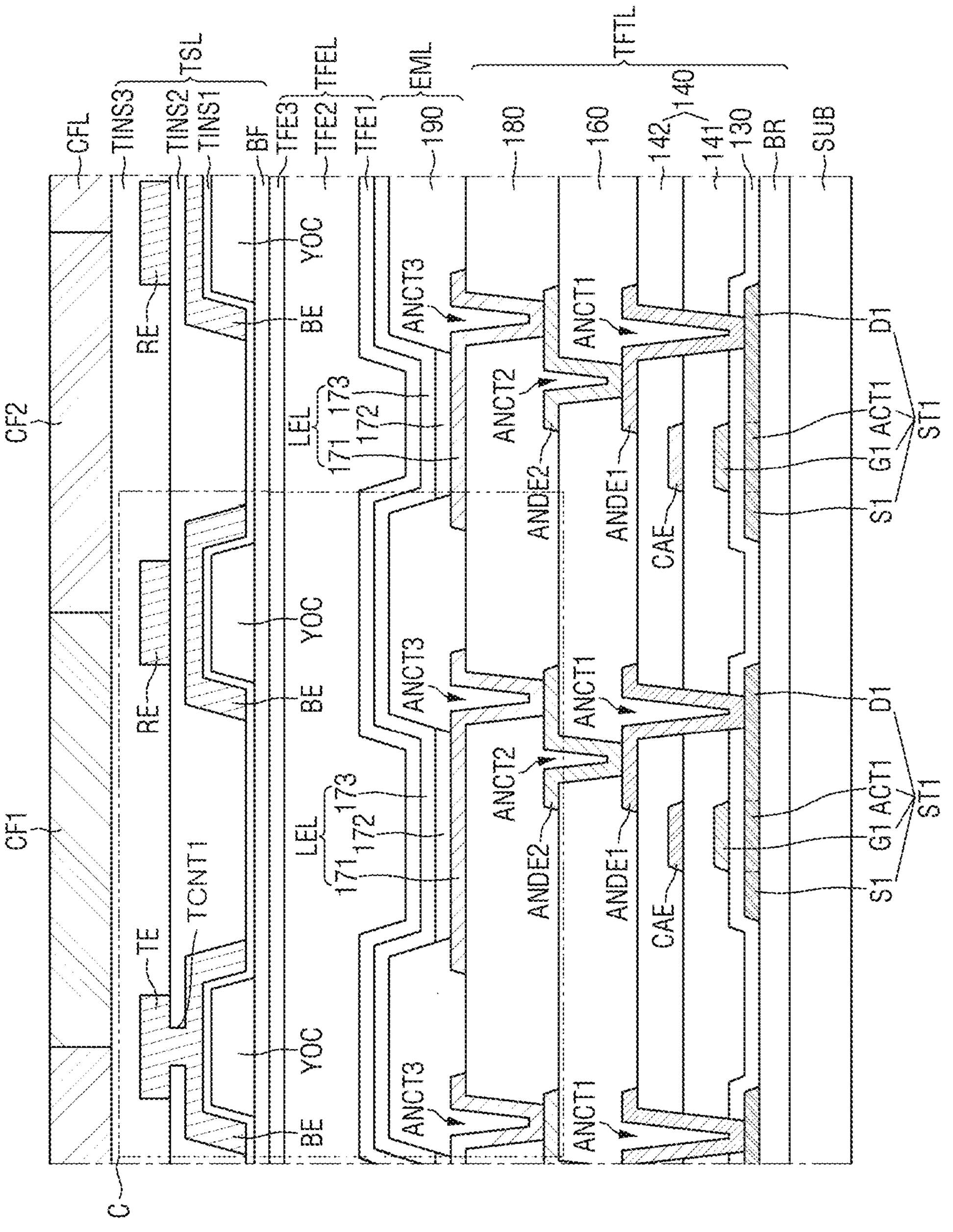
FIG. 6 is a cross-sectional view of an example of the display panel taken along the line B-B' of FIG. 5.
Figure 7:
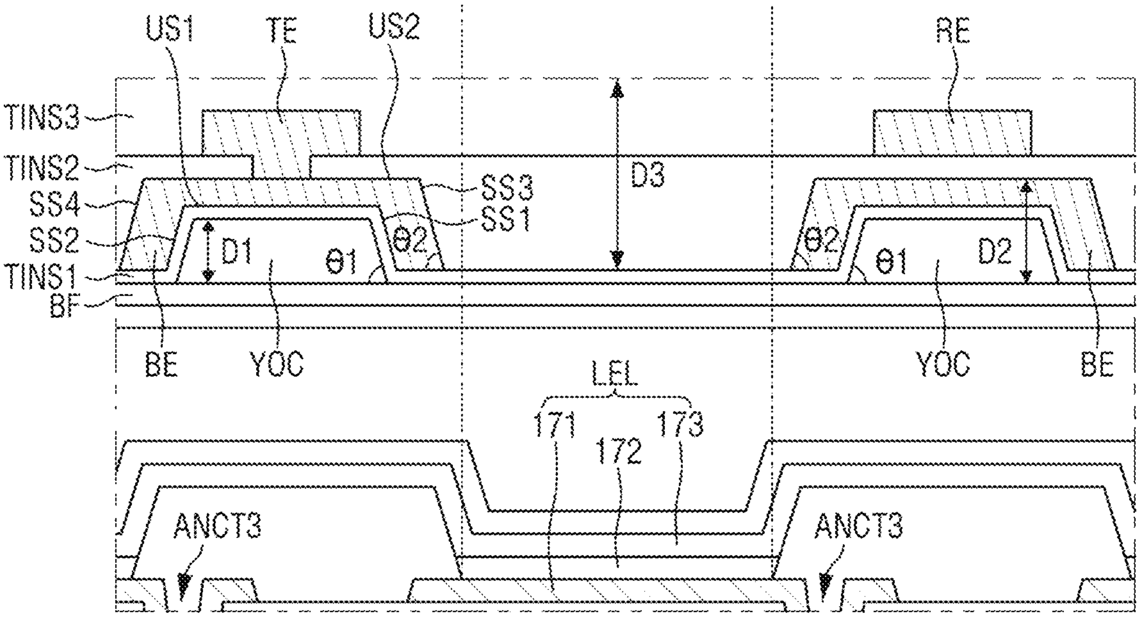
FIG. 7 is a cross-sectional view of an example of the region C of FIG. 6.
Figure 8:
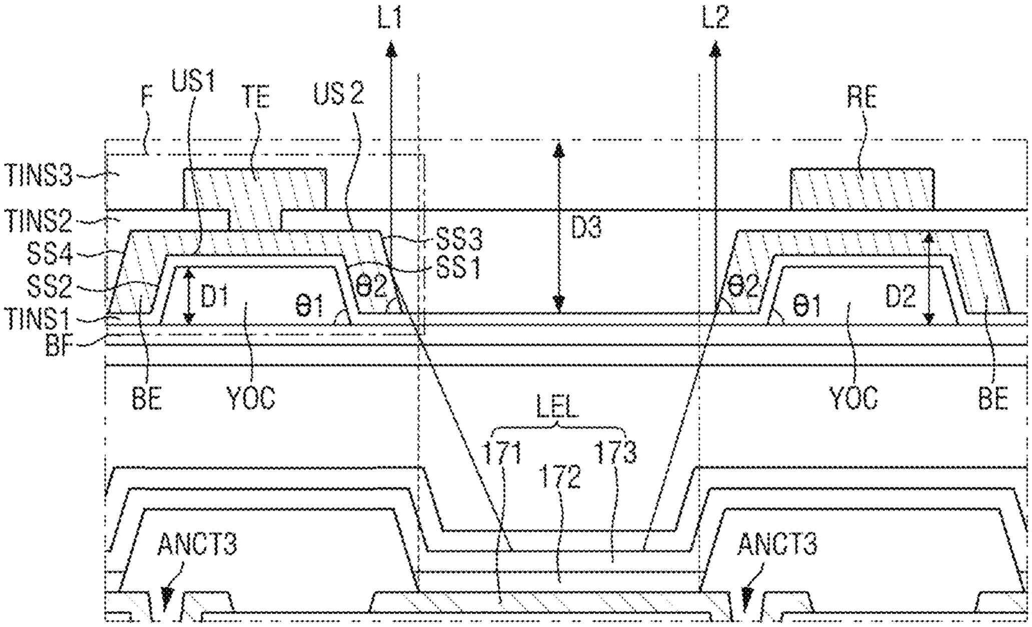
FIG. 8 is a cross-sectional view illustrating a direction of light in the display panel of FIG. 7 according to some embodiments.

FIG. 6 is a cross-sectional view of an example of the display panel taken along line B-B' of FIG. 5. FIG. 7 is a cross-sectional view of an example of region C of FIG. 6. FIG. 8 is a cross-sectional view illustrating a direction of light in the display panel of FIG. 7.

Referring to FIG. 6, a barrier film BR may be located on the substrate SUB. The substrate SUB may be made of an insulating material such as a polymer resin. For example, the substrate SUB may be made of polyimide. The substrate SUB may be a flexible substrate that may be bent, folded, and rolled.

The barrier film BR is a film for protecting transistors of a thin film transistor layer TFTL and light emitting layers 172 of a light emitting element layer EML from moisture permeating through the substrate SUB vulnerable to moisture permeation. The barrier film BR may include a plurality of inorganic films that are alternately stacked. For example, the barrier film BR may be formed as multiple films in which one or more inorganic films of a silicon nitride layer, a silicon oxynitride layer, a silicon oxide layer, a titanium oxide layer, and an aluminum oxide layer are alternately stacked.

Thin film transistor ST1 may be located on the barrier film BR. The thin film transistor ST1 includes an active layer ACT1, a gate electrode G1, a source electrode S1, and a drain electrode D1.

The active layer ACT1, the source electrode S1, and the drain electrode D1 of the thin film transistor ST1 may be located on the barrier film BR. The active layer ACT1 of the thin film transistor ST1 may include polycrystalline silicon, single crystal silicon, low-temperature polycrystalline silicon, amorphous silicon, or an oxide semiconductor. The active layer ACT1 overlapping the gate electrode G1 in the third direction (Z-axis direction), that is the thickness direction of the substrate SUB, may be defined as a channel region. The source electrode S1 and the drain electrode D1 may be regions that do not overlap the first gate electrode G1 in the third direction (Z-axis direction), and the first source electrode S1 and the drain electrode D1 may have conductivity by doping a silicon semiconductor or an oxide semiconductor with ions or impurities.

A gate insulating film 130 may be located on the active layer ACT1, the source electrode S1 and the drain electrode D1 located on the active layer ACT1 of the thin film transistor ST1. The gate insulating film 130 may be formed as an inorganic film, for example, a silicon nitride layer, a silicon oxynitride layer, a silicon oxide layer, a titanium oxide layer, or an aluminum oxide layer.

The gate electrode G1 of the thin film transistor ST1 may be located on the gate insulating film 130. The gate electrode G1 may overlap the active layer ACT1 in the third direction (Z-axis direction). The gate electrode G1 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A first interlayer insulating film 141 may be located on the gate electrode G1 of the thin film transistor ST1. The first interlayer insulating film 141 may be formed as an inorganic film, for example, a silicon nitride layer, a silicon oxynitride layer, a silicon oxide layer, a titanium oxide layer, or an aluminum oxide layer. The first interlayer insulating film 141 may be formed as a plurality of inorganic films.

A capacitor electrode CAE may be located on the first interlayer insulating film 141. The capacitor electrode CAE may overlap the gate electrode G1 of the thin film transistor ST1 in the third direction (Z-axis direction). Because the first interlayer insulating film 141 has a predetermined dielectric constant, a capacitor may be formed by the capacitor electrode CAE, the gate electrode G1, and the first interlayer insulating film 141 located therebetween. The capacitor electrode CAE may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A second interlayer insulating film 142 may be located on the capacitor electrode CAE. The second interlayer insulating film 142 may be formed as an inorganic film, for example, a silicon nitride layer, a silicon oxynitride layer, a silicon oxide layer, a titanium oxide layer, or an aluminum oxide layer. The second interlayer insulating film 142 may be formed as a plurality of inorganic films.

A first anode connection electrode ANDE1 may be located on the second interlayer insulating film 142. The first anode connection electrode ANDE1 may be connected to the first drain electrode D1 of the first thin film transistor ST1 through a first connection contact hole ANCT1 penetrating through the first gate insulating film 130, the first interlayer insulating film 141, and the second interlayer insulating film 142. The first anode connection electrode ANDE1 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A first planarization film 160 for planarizing a step due to the first thin film transistor ST1 may be located on the first anode connection electrode ANDE1. The first planarization film 160 may be formed as an organic film made of an acryl resin, an epoxy resin, a phenolic resin, a polyamide resin, a polyimide resin, or the like.

A second anode connection electrode ANDE2 may be located on the first planarization film 160. The second anode connection electrode ANDE2 may be connected to the first anode connection electrode ANDE1 through a second connection contact hole ANCT2 penetrating through the first planarization film 160. The second anode connection electrode ANDE2 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A second planarization film 180 may be located on the second anode connection electrode ANDE2. The second planarization film 180 may be formed as an organic film made of an acryl resin, an epoxy resin, a phenolic resin, a polyamide resin, a polyimide resin, or the like.

Light emitting elements LEL and a pixel defining film 190 may be located on the second planarization film 180. Each of the light emitting elements LEL includes a pixel electrode 171, a light emitting layer 172, and a common electrode 173.

The pixel electrode 171 may be located on the second planarization film 180. The pixel electrode 171 may be connected to the second anode connection electrode ANDE2 through a third connection contact hole ANCT3 penetrating through the second planarization film 180.

In a top emission structure in which light is emitted toward the common electrode 173 based on the light emitting layer 172, the pixel electrode 171 may be formed of a metal material having high reflectivity, such as a stacked structure (Ti/Al/Ti) of aluminum and titanium, a stacked structure (ITO/Al/ITO) of aluminum and indium tin oxide (ITO), an APC alloy, and a stacked structure (ITO/APC/ITO) of an APC alloy and ITO. The APC alloy is an alloy of silver (Ag), palladium (Pd), and copper (Cu).

The pixel defining film 190 may be formed to partition the pixel electrodes 171 on the second planarization film 180, in order to define the first sub-pixel EA11, the second sub-pixel EA12, the third sub-pixel EA13, and the fourth sub-pixel. The pixel defining film 190 may be arranged to cover an edge of the pixel electrode 171. The pixel defining film 190 may be formed as an organic film made of an acryl resin, an epoxy resin, a phenolic resin, a polyamide resin, a polyimide resin, or the like.

Each of the first sub-pixel EA11, the second sub-pixel EA12, the third sub-pixel EA13, and the fourth sub-pixel EA14 of each of the first pixels PX1 refers to an area in which the pixel electrode 171, the light emitting layer 172, and the common electrode 173 are sequentially stacked and holes from the pixel electrode 171 and electrons from the common electrode 173 are recombined with each other in the light emitting layer 172 to emit light.

The light emitting layer 172 may be located on the pixel electrode 171 and the pixel defining film 190. The light emitting layer 172 may include an organic material to emit light of a predetermined color. For example, the light emitting layer 172 includes a hole transporting layer, an organic material layer, and an electron transporting layer.

The common electrode 173 may be located on the light emitting layer 172. The common electrode 173 may be arranged to cover the light emitting layer 172. The common electrode 173 may be a common layer commonly formed in the first sub-pixel EA11, the second sub-pixel EA12, the third sub-pixel EA13, and the fourth sub-pixel EA14. A capping layer may be formed on the common electrode 173.

In the top emission structure, the common electrode 173 may be formed of a transparent conductive material (TCO) such as ITO or indium zinc oxide (IZO) capable of transmitting light therethrough or a semi-transmissive conductive material such as magnesium (Mg), silver (Ag), or an alloy of magnesium (Mg) and silver (Ag). When the common electrode 173 is formed of the semi-transmissive conductive material, emission efficiency may be increased by a micro cavity.

The encapsulation layer TFEL may be located on the common electrode 173. The encapsulation layer TFEL includes at least one inorganic film in order to prevent or reduce instances of oxygen or moisture permeating into the light emitting element layer EML. In addition, the encapsulation layer TFEL includes at least one organic film in order to protect the light emitting element layer EML from foreign materials such as dust. For example, the encapsulation layer TFEL includes a first encapsulation inorganic film TFE1, an encapsulation organic film TFE2, and a second encapsulation inorganic film TFE3.

The first encapsulation inorganic film TFE1 may be located on the common electrode 173, the encapsulation organic film TFE2 may be located on the first encapsulation inorganic film TFE1, and the second encapsulation inorganic film TFE3 may be located on the encapsulation organic film TFE2. The first encapsulation inorganic film TFE1 and the second encapsulation inorganic film TFE3 may be formed as multiple films in which one or more inorganic films of a silicon nitride layer, a silicon oxynitride layer, a silicon oxide layer, a titanium oxide layer, and an aluminum oxide layer are alternately stacked. The encapsulation organic film TFE2 may be an organic film made of an acryl resin, an epoxy resin, a phenolic resin, a polyamide resin, a polyimide resin, or the like.

A buffer layer BF may be located on the encapsulation layer TFEL. The buffer layer BF may include a plurality of inorganic films that are alternately stacked. For example, the buffer layer BF may be formed as multiple films in which one or more inorganic films of a silicon nitride layer, a silicon oxynitride layer, a silicon oxide layer, a titanium oxide layer, and an aluminum oxide layer are alternately stacked. The buffer layer BF may be omitted.

The touch sensing layer TSL is formed on the buffer layer BF. The touch sensing layer TSL includes a pseudo-reflection pattern YOC, a first touch insulating layer TINS1, the connection electrode BE, a second touch insulating layer TINS2, the driving electrode TE, the sensing electrode RE, and a third touch insulating layer TINS3.

The pseudo-reflection pattern YOC may be located on the buffer layer BF.

The planar shape of the pseudo-reflection pattern YOC may consider the shape of the connection electrode BE. The planar shape of the connection electrode BE may depend on the planar shape of the pseudo-reflection pattern YOC. For example, when the pseudo-reflection pattern YOC is shaped like a bracket a shape ("<" or ">"), the connection electrode BE may also have a shape of a bracket shape ("<" or ">").

The pseudo-reflection pattern YOC may be formed of a low-temperature curable photosensitive resin composition. The low-temperature curable photosensitive resin composition is at least one selected from the group consisting of an epoxy-modified siloxane binder or an epoxy monomer, which is alkali-soluble, has a double bond and has reactivity by heat in order to increase the degree of curing of the film. The low-temperature curable photosensitive resin composition includes an alkali-soluble binder resin thermal cross-linking type binder resin, a monomer photo-cross-linking agent thermal curing agent photo-initiator pigment additive, and a solvent.

The pseudo-reflection pattern YOC is formed of the same material as the material of the protective layer of the component hole OH, which will be described later with reference to FIGS. 18 and 19. The pseudo-reflection pattern YOC is formed in the same process as the protective layer of the component hole OH. The protective layer of the component hole OH is a transparent protective film that can be cured at a low temperature and has excellent transmittance even while having high hardness characteristics.

Referring to FIGS. 6 and 7, the pseudo-reflection pattern YOC overlaps the pixel defining film 190 and does not overlap the light emitting layer 172. Accordingly, it may be possible to prevent or reduce instances of an opening area of each of the light emitting layer 172 being reduced due to the pseudo-reflection pattern YOC.

The pseudo-reflection pattern YOC may include a first inclined surface SS1 adjacent to the light emitting layer 172, a second inclined surface SS2 facing the first inclined surface SS1, and a first upper surface US1 that connects the first inclined surface SS1 and the second inclined surface SS2. The first inclined surface SS1 of the pseudo-reflection pattern YOC may be an inner surface of the pseudo-reflection pattern YOC, and the second inclined surface SS2 may be an outer surface of the pseudo-reflection pattern YOC.

A first taper angle θ1 of the first inclined surface SS1 of the pseudo-reflection pattern YOC may be less than or equal to 90 degrees, and therefore the first inclined surface SS1 of the pseudo-reflection pattern YOC may have a regular taper. The first taper angle θ1 is an inclination angle of the first inclined surface SS1 and indicates an angle formed between the buffer layer BF and the first inclined surface SS1 of the pseudo-reflection pattern YOC.

The first touch insulating layer TINS1 is located on the buffer layer BF and the pseudo-reflection pattern YOC.

The connection electrode BE may be located on the first touch insulating layer TINS1.

The connection electrode BE overlaps the pixel defining film 190 and does not overlap the light emitting elements LEL. The connection electrode BE overlaps the pseudo-reflection pattern YOC. The connection electrode BE may include a third inclined surface SS3 overlapping the first inclined surface SS1, a fourth inclined surface SS4 overlapping the second inclined surface SS2, and a second upper surface US2 located on the first upper surface US1. The first upper surface US1 may connect the first inclined surface SS1 and the second inclined surface SS2. The second upper surface US2 may connect the third inclined surface SS3 and the fourth inclined surface SS4. The third inclined surface SS3 of the connection electrode BE may be an inner surface of the connection electrode BE, and the fourth inclined surface SS4 may be an outer surface of the connection electrode BE.

A second taper angle θ2 of the third inclined surface SS3 of the connection electrode BE may be more than or equal to 60 degrees and less than or equal to 90 degrees, and therefore the third inclined surface SS3 of the connection electrode BE may have a regular taper. The second taper angle θ2 is an inclination angle of the third inclined surface SS3 and indicates an angle formed between the first touch insulating layer TINS1 and the third inclined surface SS3 of the connection electrode BE.

The connection electrode BE may be a single layer or a multilayer made of any one or more of molybdenum (Mo), aluminum (Al), chromium (Cr), gold (Au), titanium (Ti), nickel (Ni), neodymium (Ne), copper (Cu), and alloys of the same.

The second touch insulating layer TINS2 is located on the connection electrode BE. The second touch insulating layer TINS2 may be made of an inorganic layer such as a silicon nitride layer, a silicon oxynitride layer, a silicon oxide layer, a titanium oxide layer, or an aluminum oxide layer. Alternatively, the second touch insulating layer TINS2 may be made of an organic layer such as acryl resin, epoxy resin, phenolic resin, polyamide resin, or polyimide resin.

The driving electrodes TE and the sensing electrodes RE may be located on the second touch insulating layer TINS2. In addition to the driving electrodes TE and the sensing electrodes RE, dummy patterns DE, first touch driving lines TL1, second touch driving lines TL2, and touch sensing lines RL illustrated in FIG. 4 may be located on the second touch insulating layer TINS2. Each of the driving electrodes TE and the sensing electrodes RE may be a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

The driving electrodes TE and the sensing electrodes RE may overlap the connection electrodes BE in the third direction (Z-axis direction). Each of the driving electrodes TE may be connected to a connection electrode BE through a first touch contact hole TCNT1 penetrating the second touch insulating layer TINS2.

The third touch insulating layer TINS3 is formed on the driving electrodes TE and the sensing electrodes RE. The third touch insulating layer TINS3 may planarize steps formed by the driving electrodes TE, the sensing electrodes RE, and the connection electrodes BE. The third touch insulating layer TINS3 may be made of an organic layer such as acryl resin, epoxy resin, phenolic resin, polyamide resin, or polyimide resin.

The color filter layer CFL is located on the third touch insulating layer TINS3. The color filter layer CFL may include a plurality of color filters CF1 and CF2 located adjacent to each other on a plane. That is, the color filter layer CFL may include a first color filter CF1 that transmits the first light, a second color filter CF2 that transmits the second light, and a third color filter that transmits the third light. For example, the first color filter CF1 may be a blue filter, the second color filter CF2 may be a green filter, and the third color filter may be a red filter. Each of the color filters CF1 and CF2 may include a polymer photosensitive resin and a pigment or dye. The first color filter CF1 may include a blue pigment or dye, the second color filter CF2 may include a green pigment or dye, and the third color filter may include a red pigment or dye.

Meanwhile, embodiments according to the present disclosure are not limited thereto, and the first color filter CF1 may not include a pigment or dye. The first color filter CF1 may include a polymer photosensitive resin and may not include a pigment or dye. The first color filter CF1 may be transparent. The first color filter CF1 may be formed of a transparent photosensitive resin.

Referring to FIGS. 7 and 8, the first light L1 and the second light L2 are light emitted from the organic light emitting layer 172 and reflected from the third inclined surface SS3 of the connection electrode BE. Light emitted from the light emitting layer 172 and incident on the third inclined surface SS3 of the connection electrode BE may travel upward by the third inclined surface SS3. As such, the inclined surface SS3 of the connection electrode BE may serve as a reflective barrier. As a height D2 of the reflective barrier is thicker, the ratio of light reflected from the third inclined surface SS3 of the connection electrode BE and traveling in the upper direction (Z-axis direction) among the light emitted from the light emitting elements LEL may increase. Because the height D2 of the reflective barrier is proportional to the thickness D1 of the pseudo-reflection pattern YOC, the higher the thickness D1 of the pseudo-reflection pattern YOC, the higher the reflectivity. Therefore, in order to increase the light output efficiency of the light emitting elements LEL, the thickness D1 of the pseudo reflection pattern YOC may be 1.5 μm or more, and according to some embodiments may be formed to be about 3 μm.

Figure 9:
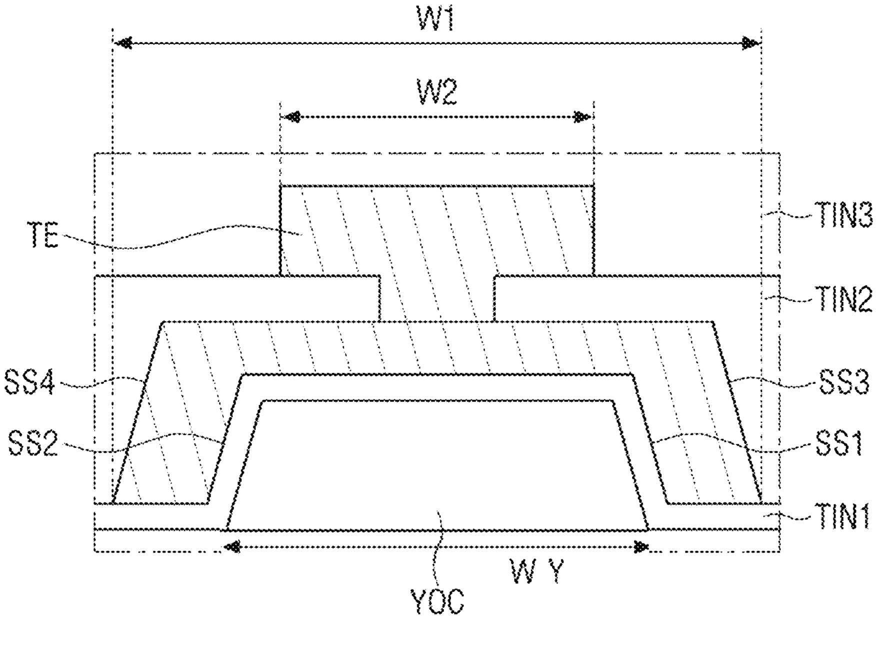
FIG. 9 is a cross-sectional view illustrating an example of region F of FIG. 8 in more detail.
Figure 10:
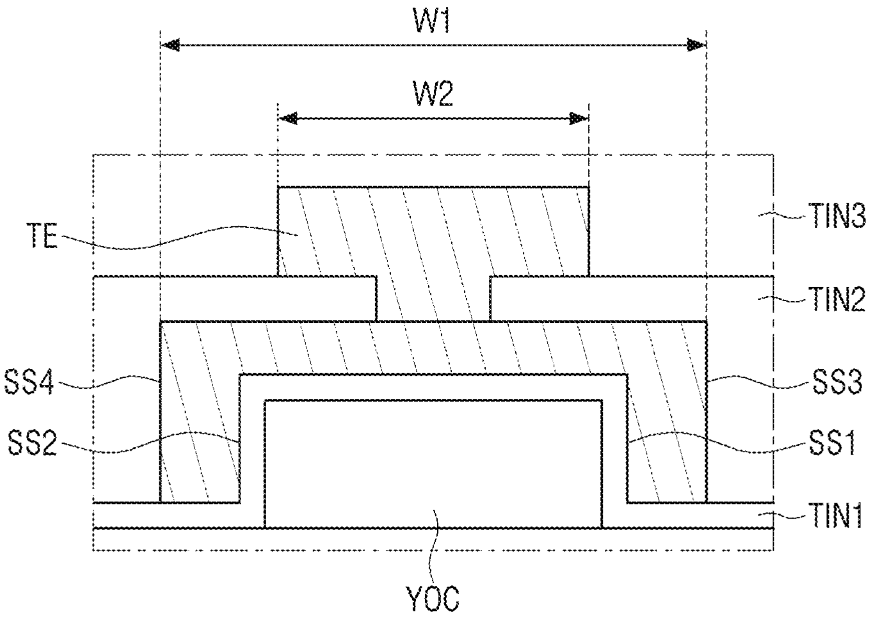
FIGS. 10 and 11 are cross-sectional views illustrating another examples of region F of FIG. 8 in more detail.
Figure 11:
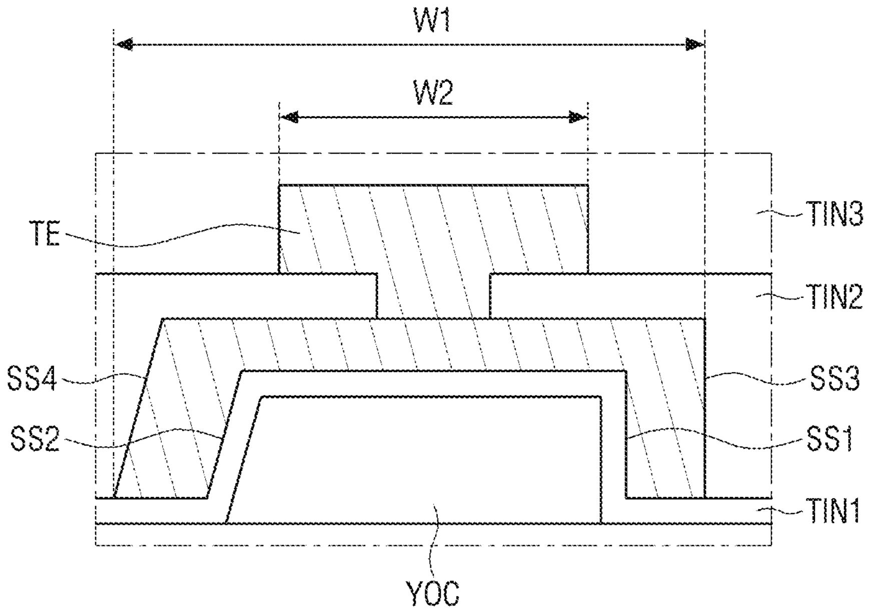

FIG. 9 is a cross-sectional view illustrating an example of region F of FIG. 8 in detail. FIG. 9 is a cross-sectional view illustrating an example of region F of FIG. 8 in detail. FIGS. 10 and 11 are cross-sectional views illustrating another examples of region F of FIG. 8 in detail.

Referring to FIG. 9, a width W1 of the connection electrode BE is greater than a width W2 of the driving electrode TE. A width WY of the pseudo-reflection pattern YOC may be equal to or greater than the width W2 of the driving electrode TE. The width WY of the pseudo-reflection pattern YOC is smaller than the width W1 of the connection electrode BE.

As shown in FIG. 10, an angle formed by each of the first inclined surface SS1, the second inclined surface SS2, the third inclined surface SS3, and the fourth inclined surface SS4 may be 90 degrees, and as shown in FIG. 11, the first inclined surface SS1 and the second inclined surface SS2 may be different from each other. In addition, the third inclined surface SS3 and the fourth inclined surface SS4 may be different from each other. The pseudo-reflection pattern YOC may have an asymmetric shape in cross-section. The connection electrode BE may have an asymmetric shape in cross-section.

Figure 12:
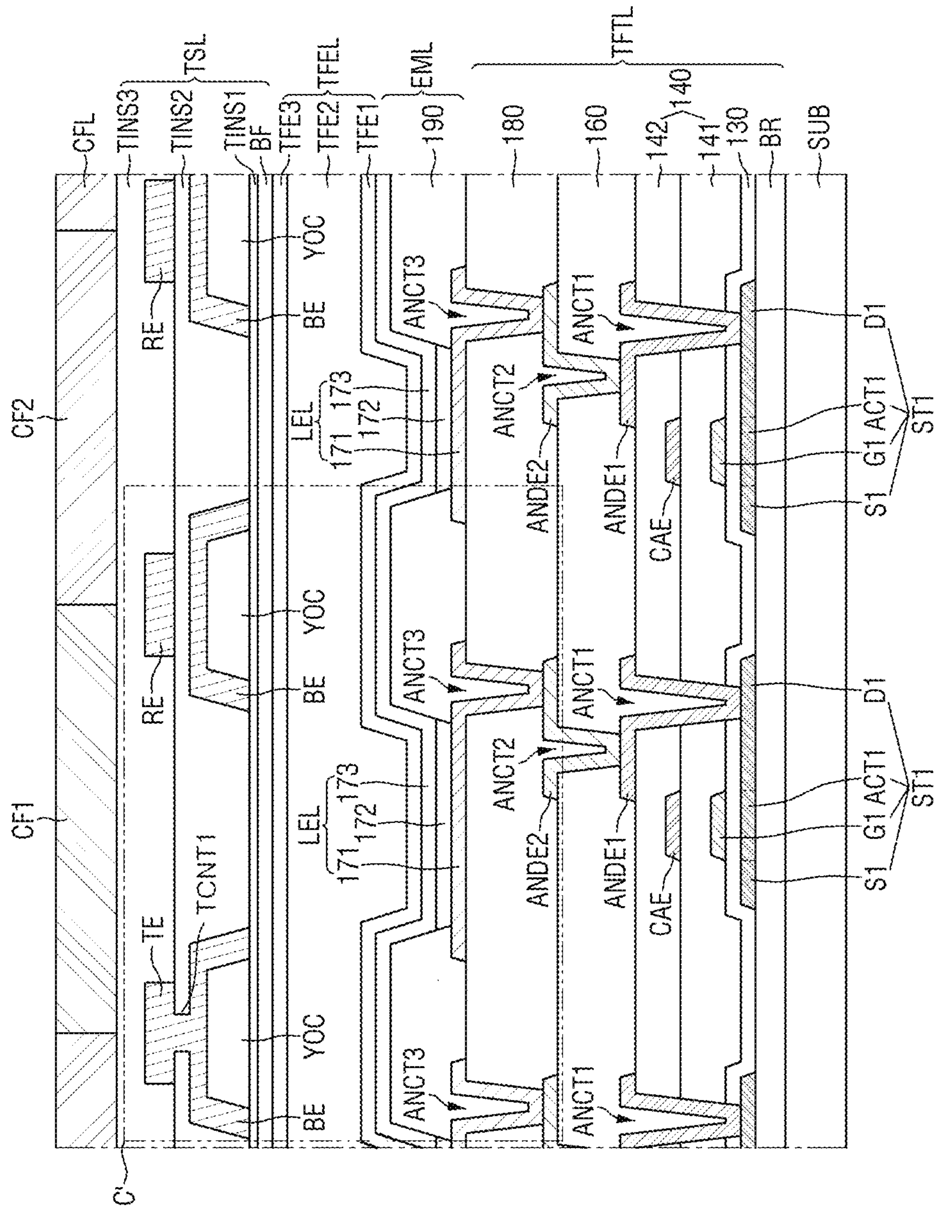
FIG. 12 is a cross-sectional view illustrating another example of the display panel taken along the line B-B' of FIG. 5.
Figure 13:
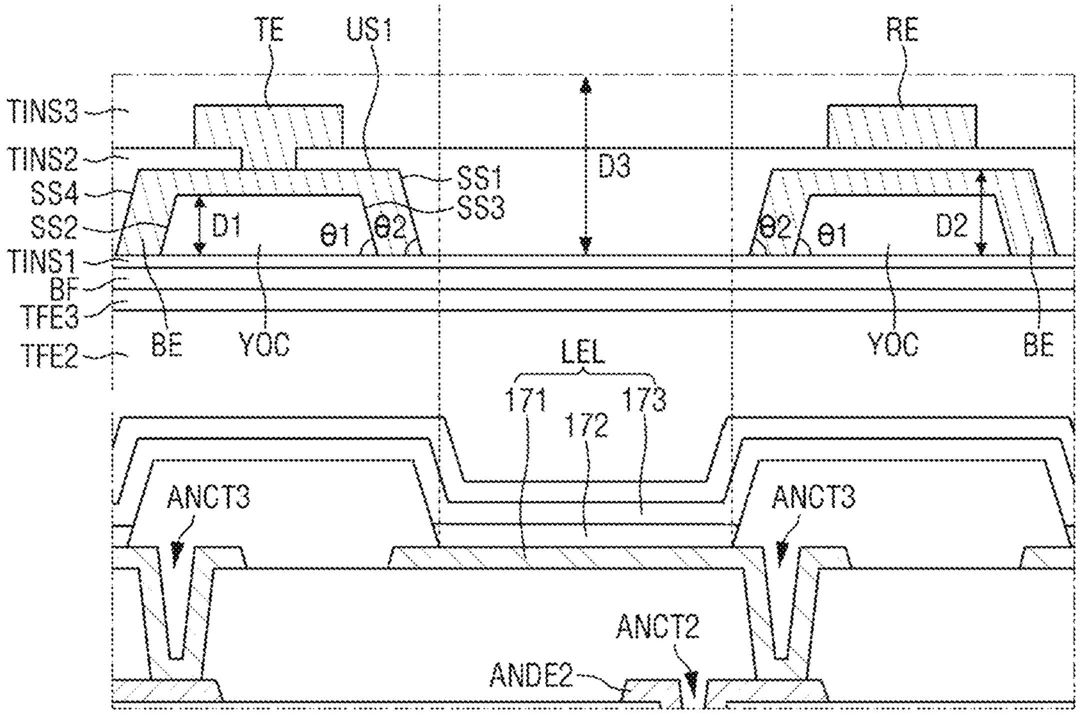
FIG. 13 is a cross-sectional view illustrating an example of a region C' of FIG. 12 in more detail.

FIG. 12 is a cross-sectional view illustrating another example of the display panel taken along line B-B' of FIG. 5. FIG. 13 is a cross-sectional view illustrating an example of a region C' of FIG. 12 in detail.

Referring to FIGS. 5, 12 and 13, the buffer layer BF may be located on the encapsulation layer TFEL. The buffer layer BF may include a plurality of inorganic layers alternately stacked. For example, the buffer layer BF may be an inorganic material layer including at least one inorganic material among silicon nitride, silicon oxide, and silicon oxynitride. The buffer layer BF may be formed of a single layer or a plurality of layers. The buffer layer BF may be omitted.

The touch sensing layer TSL is formed on the buffer layer BF. The touch sensing layer TSL includes the first touch insulating layer TINS1, the pseudo-reflection pattern YOC, the connection electrode BE, the second touch insulating layer TINS2, the driving electrode TE, the sensing electrode RE, and the third touch insulating layer TINS3.

The first touch insulating layer TINS1 may be located on the buffer layer BF. When the buffer layer BF is omitted, the first touch insulating layer TINS1 may be located on the encapsulation layer TFEL.

The pseudo-reflection pattern YOC may be located on the first touch insulating layer TINS1.

The pseudo-reflection pattern YOC overlaps the pixel defining film 190 and does not overlap the light emitting layer 172.

The connection electrode BE may be located on the first touch insulating layer TINS1.

The connection electrode BE overlaps the pixel defining film 190 and does not overlap the light emitting elements LEL. The connection electrode BE overlaps the pseudo-reflection pattern YOC. The connection electrode BE includes the third inclined surface SS3 overlapping the first inclined surface SS1, the fourth inclined surface SS4 overlapping the second inclined surface SS2, and the second upper surface US2 located on the first upper surface US1. The first upper surface US1 may connect the first inclined surface SS1 and the second inclined surface SS2. In addition, the second upper surface US2 may connect the third inclined surface SS3 and the fourth inclined surface SS4. The third inclined surface SS3 of the connection electrode BE may be an inner surface of the connection electrode BE, and the fourth inclined surface SS4 may be an outer surface of the connection electrode BE.

The second taper angle θ2 of the third inclined surface SS3 of the connection electrode BE may be more than or equal to 60 degrees and less than or equal to 90 degrees, and therefore, the third inclined surface SS3 of the connection electrode BE may have a regular taper. The second taper angle θ2 is an inclination angle of the third inclined surface SS3 and indicates an angle formed between the first touch insulating layer TINS1 and the third inclined surface SS3 of the connection electrode BE.

The connection electrode BE may be a single layer or a multilayer made of any one or more of molybdenum (Mo), aluminum (Al), chromium (Cr), gold (Au), titanium (Ti), nickel (Ni), neodymium (Ne), copper (Cu), and alloys of the same.

The second touch insulating layer TINS2 is located on the connection electrode BE. The second touch insulating layer TINS2 may be made of an inorganic layer such as a silicon nitride layer, a silicon oxynitride layer, a silicon oxide layer, a titanium oxide layer, or an aluminum oxide layer. Alternatively, the second touch insulating layer TINS2 may be made of an organic layer such as acryl resin, epoxy resin, phenolic resin, polyamide resin, or polyimide resin.

The driving electrodes TE and the sensing electrodes RE may be located on the second touch insulating layer TINS2. In addition to the driving electrodes TE and the sensing electrodes RE, dummy patterns DE, first touch driving lines TL1, second touch driving lines TL2, and touch sensing lines RL illustrated in FIG. 4 may be located on the second touch insulating layer TINS2.

The driving electrodes TE and the sensing electrodes RE may overlap the connection electrodes BE in the third direction (Z-axis direction). Each of the driving electrodes TE may be connected to a connection electrode BE through the first touch contact hole TCNT1 penetrating the second touch insulating layer TINS2.

The third touch insulating layer TINS3 is formed on the driving electrodes TE and the sensing electrodes RE. The third touch insulating layer TINS3 may planarize steps formed by the driving electrodes TE, the sensing electrodes RE, and the connection electrodes BE. The third touch insulating layer TINS3 may be made of an organic layer such as acryl resin, epoxy resin, phenolic resin, polyamide resin, or polyimide resin.

In the embodiments of FIG. 12, the thin film transistor layer TFTL, the light emitting element layer EML, the thin film encapsulation layer TFEL, and the color filter layer CFL of the embodiments of FIG. 6 are substantially the same, and there is only a difference from the embodiments of FIG. 6 in that the first touch insulating layer TINS1 of the touch sensing layer TSL is arranged under the pseudo-reflection pattern YOC. Therefore, some detailed description of the embodiments of FIG. 12 may be omitted.

Figure 15:
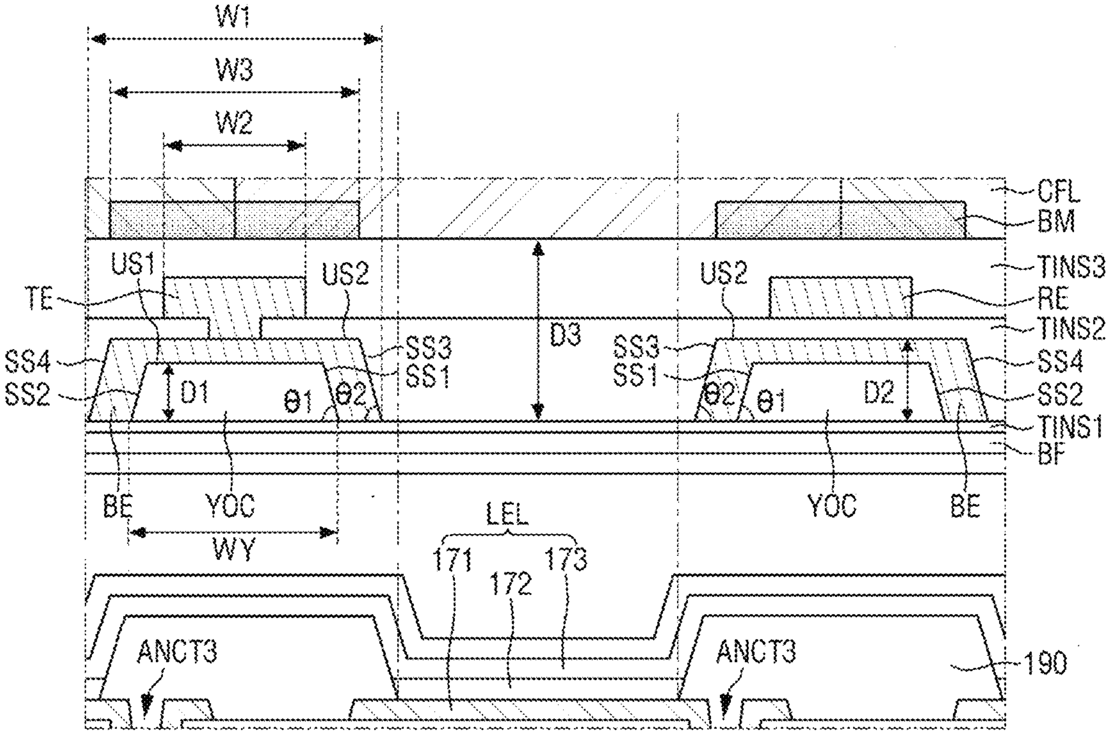
FIG. 15 is a cross-sectional view illustrating an example of region G of FIG. 14 in more detail.
Figure 16:
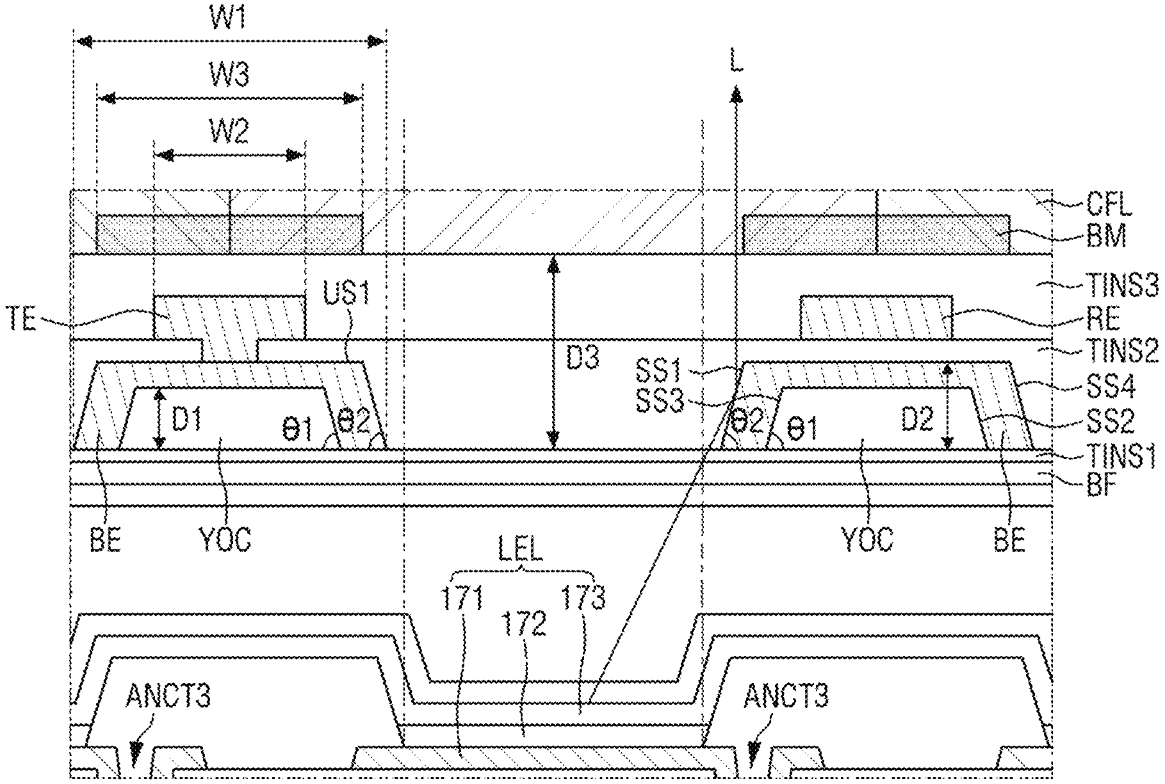
FIG. 16 is a cross-sectional view illustrating a direction of light in FIG. 15.
Figure 17:
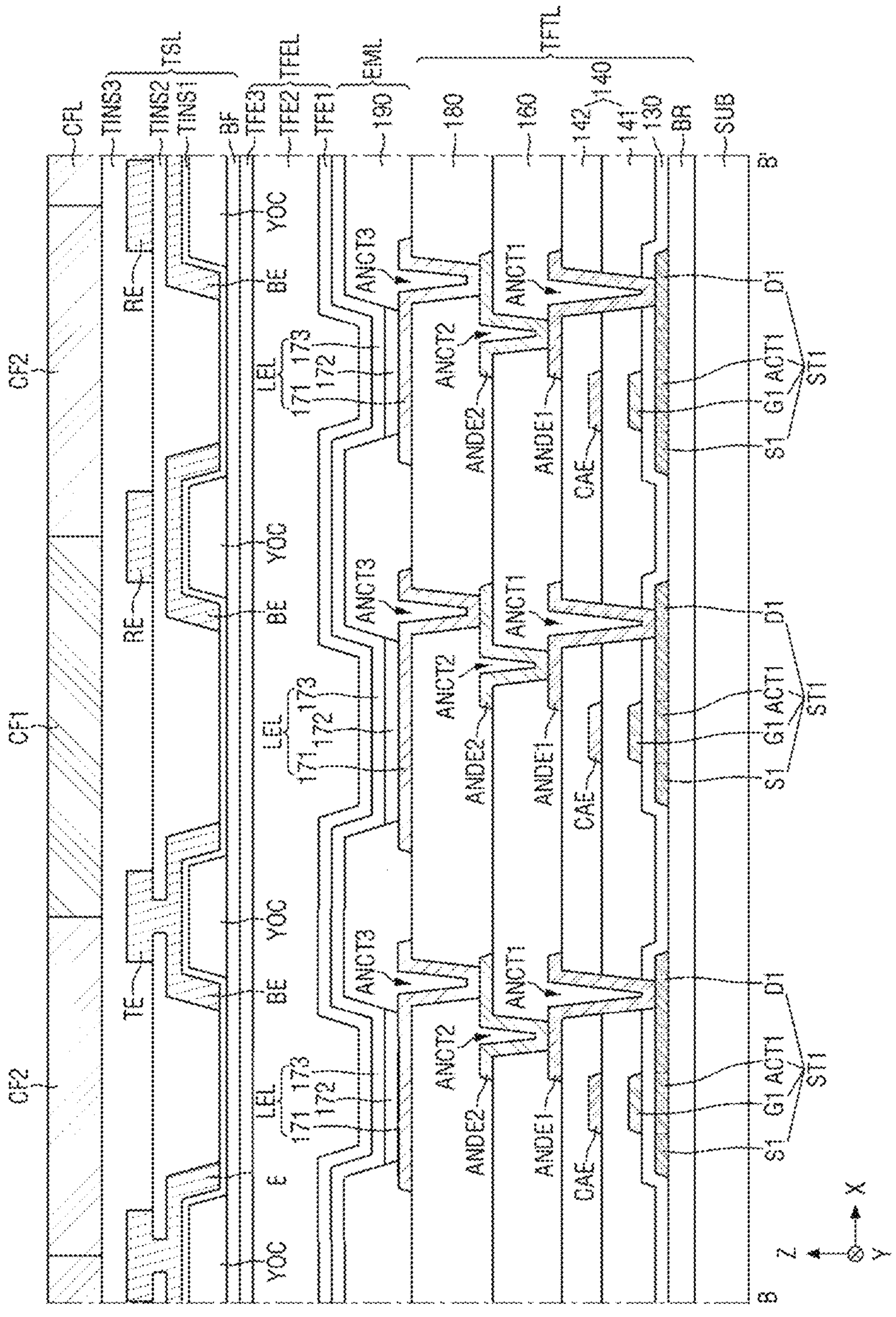
FIG. 17 is a cross-sectional view illustrating an example of the display panel taken along the line C-C' of FIG. 5.

FIG. 14 is a cross-sectional view illustrating still another example of the display panel taken along line B-B' of FIG. 5 in detail. FIG. 15 is a cross-sectional view illustrating an example of region G of FIG. 14 in detail. FIG. 16 is a cross-sectional view illustrating a direction of light in FIG. 15.

Referring to FIGS. 14 and 15, the color filter layer CFL may include a light blocking member BM and a color filter CF.

The light blocking member BM may be located on a third touch insulating layer TINS3. The plurality of light blocking members BM may be arranged to be spaced apart from each other while exposing a portion of the third touch insulating layer TINS3. Color filters CF1 and CF2 may be located between the light blocking members BM.

The color filter layer CFL may include the plurality of color filters CF1 and CF2 located adjacent to each other on a plane. That is, the color filter layer CFL may include a first color filter CF1 that transmits the first light, a second color filter CF2 that transmits the second light, and a third color filter that transmits the third light. For example, the first color filter CF1 may be a blue filter, the second color filter CF2 may be a green filter, and the third color filter may be a red filter.

The light blocking member BM may be a black matrix. The light blocking member BM may include an organic light blocking material or an inorganic light blocking material including a black pigment or black dye. The light blocking member BM may prevent or reduce a light leakage phenomenon and distinguish a boundary between the adjacent color filters CF1 and CF2.

The plurality of light blocking members BM may be arranged to be spaced apart from each other, and each of the light blocking members BM may correspondingly overlap each of the connection electrode BE and the pseudo-reflection pattern YOC.

Referring to FIGS. 15 and 16, the connection electrode BE overlaps the pixel defining film 190 and does not overlap the light emitting elements LEL. The connection electrode BE overlaps the pseudo-reflection pattern YOC. The connection electrode BE may include the third inclined surface SS3 overlapping the first inclined surface SS1, the fourth inclined surface SS4 overlapping the second inclined surface SS2, and the second upper surface US2 located on the first upper surface US1. The first upper surface US1 may connect the first inclined surface SS1 and the second inclined surface SS2. The second upper surface US2 may connect the third inclined surface SS3 and the fourth inclined surface SS4. The third inclined surface SS3 of the connection electrode BE may be an inner surface of the connection electrode BE, and the fourth inclined surface SS4 may be an outer surface.

The second taper angle θ2 of the third inclined surface SS3 of the connection electrode BE may be more than or equal to 60 degrees and less than or equal to 90 degrees, and therefore, the third inclined surface SS3 of the connection electrode BE may have a regular taper. The second taper angle θ2 is an inclination angle of the third inclined surface SS3 and indicates an angle formed between the first touch insulating layer TINS1 and the third inclined surface SS3 of the connection electrode BE.

The width W1 of the connection electrode BE is greater than the width W2 of the driving electrode TE. The width WY of the pseudo-reflection pattern YOC may be equal to or greater than the width W2 of the driving electrode TE.

The width WY of the pseudo-reflection pattern YOC is smaller than the width W1 of the connection electrode BE.

The light blocking members BM have a width W3 wider than the width W2 of the driving electrode TE and equal to or smaller than the width W1 of the connection electrode BE.

In the embodiments of FIG. 15, the thin film transistor layer TFTL, the light emitting element layer EML, and the thin film encapsulation layer TFEL of the embodiments of FIG. 12 are substantially the same, and there is only a difference from the embodiments of FIG. 12 in that the light blocking members are included in the color filters CFL. Therefore, a detailed description of the embodiments of FIG. 15 will be omitted.

Figure 18:
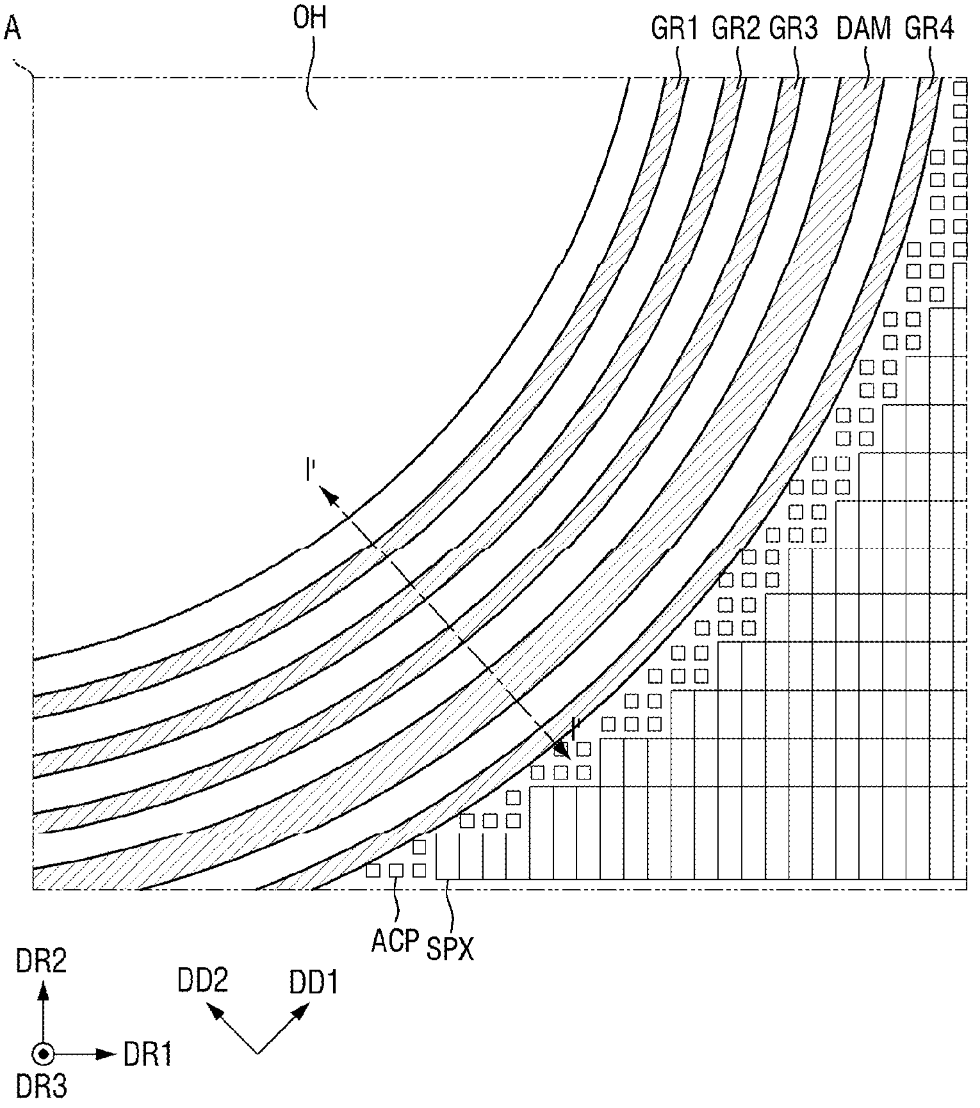
FIG. 18 is a layout view illustrating a part of a component hole of FIG. 4 in more detail.

FIG. 18 is a layout view illustrating a part of a component hole of FIG. 4 in detail. FIG. 19 is a plan view taken along line I-I' of FIG. 18. Additionally, FIG. 18 may correspond to area A of FIG. 2.

FIG. 18 is a plan view of an encapsulation area below the touch sensing layer TSL of FIG. 4.

Referring to FIG. 18, the component hole OH of FIG. 4 is arranged to be surrounded by the encapsulation area in a plan view.

The encapsulation area may include at least one dam DAM and a plurality of grooves GR1 to GR4 formed inside and outside the dam DAM. The first to third grooves GR1 to GR3 may be located inside the dam DAM adjacent to the hole OH, and the fourth groove GR4 may be located outside the dam DAM. In FIG. 18, only four grooves are illustrated for convenience of explanation, but the present invention is not limited thereto.

Figure 19:
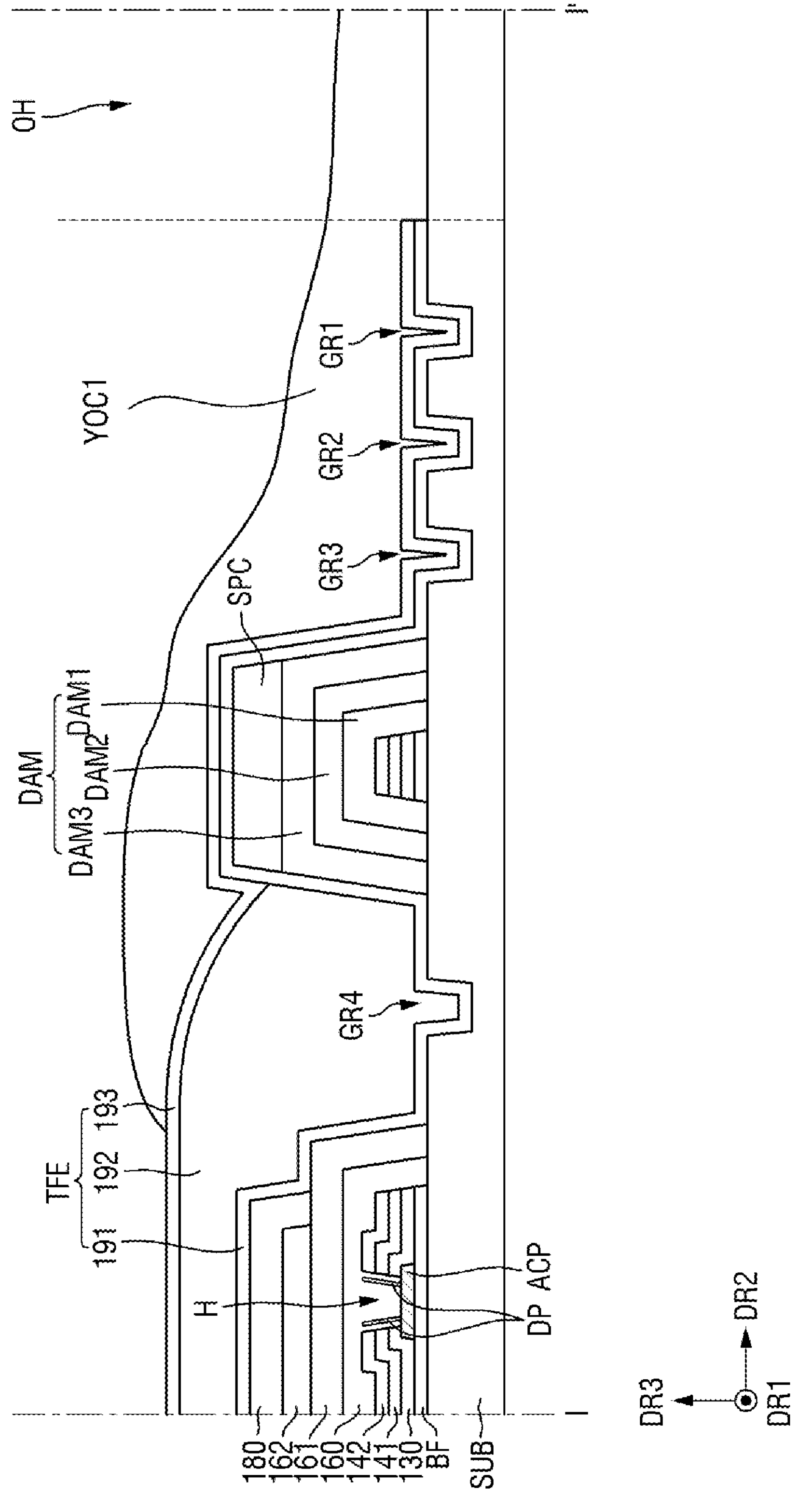
FIG. 19 is a plan view taken along the line I-I' of FIG. 18.

As illustrated in FIG. 19, as the organic layer of the encapsulation layer TFE is blocked by the dam DAM, the inorganic layers are located inside the dam DAM, thereby realizing an inorganic encapsulation structure.

The encapsulation layer TFE includes a first encapsulation inorganic layer 191, a second encapsulation organic layer 192, and a third inorganic encapsulation layer 193.

The dam DAM may include a first dam DAM1 formed by the same process with the same material as a second planarization layer 180, a second dam DAM2 formed by the same process with the same material as a third planarization layer 162, a third dam DAM3 formed by the same process with the same material as the pixel defining film 190, and a fourth dam DAM4 formed by the same process with the same material as a spacer SPC. The first to fourth grooves GR1 to GR4 may be formed by removing a portion of the upper surface of the substrate SUB, and may have a groove shape.

In addition, the sub-pixels SPX may be located immediately adjacent to the encapsulation area. Therefore, because the distance between the component hole OH and the area in which the sub-pixels SPX are located can be minimized or reduced, it can be improved that the distance between the component hole OH and the sub-pixels SPX is recognized by the user as the non-display area.

Meanwhile, active patterns ACP may be located in a space between the sub-pixels SPX and the component hole OH.

A protective layer YOC1 may be located on the encapsulation area. The protective layer YOC1 overlaps the dam DAM and the plurality of grooves GR1 to GR4 formed inside and outside the dam DAM. The protective layer YOC1 may overlap from the boundary of the component hole OH to a partial region of the component hole OH. The protective layer YOC1 and the pseudo-reflection pattern YOC described with reference to FIGS. 6 to 17 are formed of the same material in the same process. Therefore, an additional mask is unnecessary.

Figure 20:
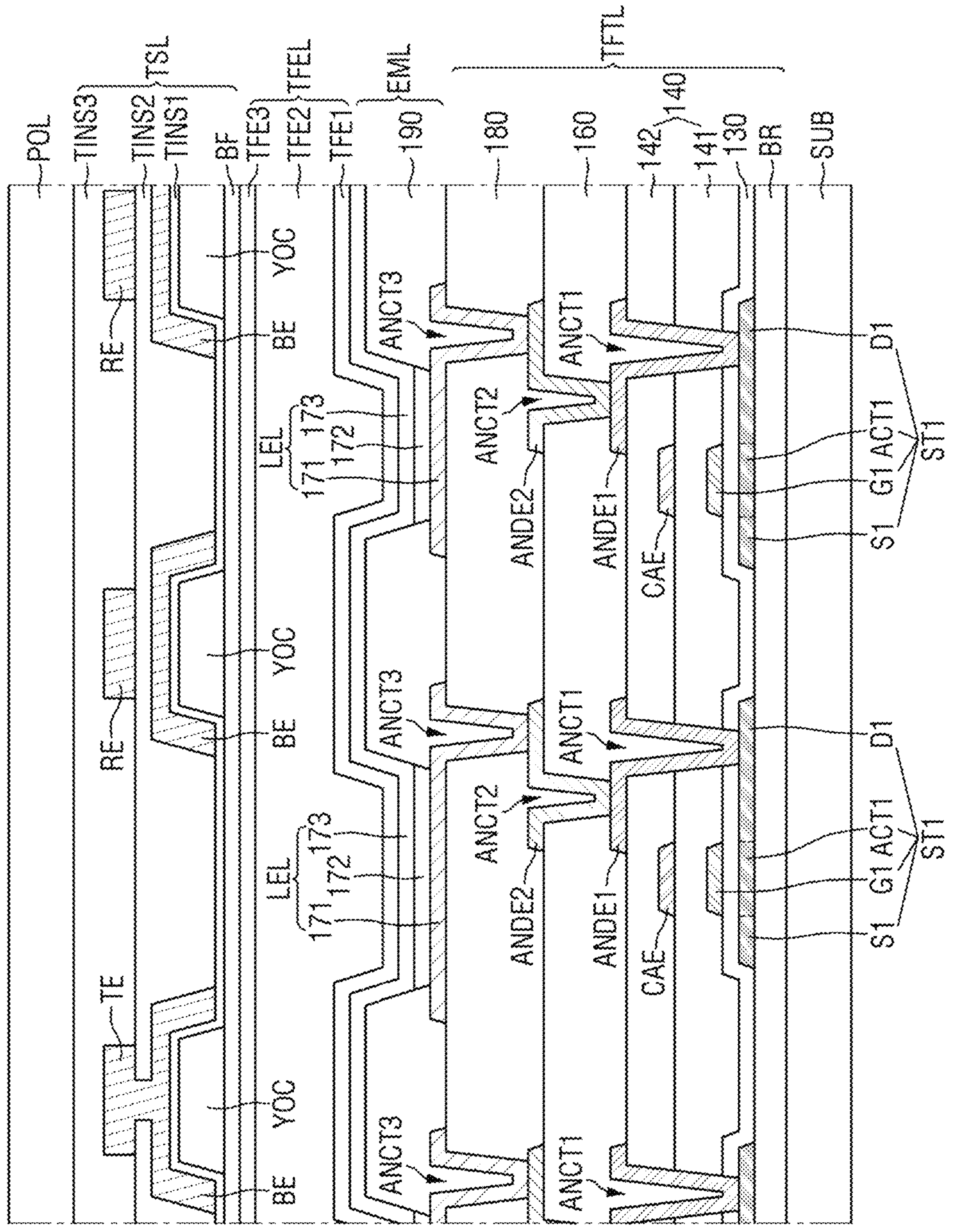
FIG. 20 is a cross-sectional view illustrating another example of the display panel taken along the line B-B' of FIG. 5.

FIG. 20 is a cross-sectional view illustrating another example of the display panel taken along line B-B' of FIG. 5.

A polarizing film POL may be formed replacing the color filters CF1 and CF2 of FIG. 6. The polarizing film POL may prevent or reduce instances of external light being reflected from the display panel 100 and thus, prevent or reduce instances of visibility of an image displayed by the display panel 100 being deteriorated.

In the embodiments of FIG. 20, the thin film transistor layer TFTL, the light emitting element layer EML, and the thin film encapsulation layer TFEL of the embodiments of FIG. 6 are substantially the same, and there is only a difference from the embodiments of FIG. 12 in that the polarizing film POL is formed replacing the color filters CF1 and CF2. Therefore, a detailed description of the embodiments of FIG. 20 will be omitted.

However, the aspects of the disclosure are not restricted to those set forth herein. The above and other aspects of the disclosure will become more apparent to one of daily skill in the art to which the disclosure pertains by referencing the claims, with equivalents thereof to be included therein.

What is claimed is:

1. A display device comprising:
- a light emitting element layer including a sub-pixel and a pixel defining film defining the sub-pixel;
- a pseudo-reflection pattern overlapping the pixel defining film;
- a connection electrode on the pseudo-reflection pattern;
- a component hole penetrating the light emitting element layer and a thin film encapsulation layer;
- an inorganic encapsulation layer surrounding the component hole; and
- a protective layer on the inorganic encapsulation layer,
- wherein the pseudo-reflection pattern is formed of a same material as the protective layer.

2. The display device of claim 1, wherein the pseudo-reflection pattern is formed of low-temperature curable photosensitive resin composition.

3. The display device of claim 2, wherein the low-temperature curable photosensitive resin composition is at least one selected from the group consisting of an epoxy-modified siloxane binder or an epoxy monomer, which is alkali-soluble, has a double bond and has reactivity by heat.

* * * * *